United States Patent
Qing et al.

(10) Patent No.: US 12,106,722 B2
(45) Date of Patent: Oct. 1, 2024

(54) DISPLAY SUBSTRATE AND MANUFACTURING METHOD THEREFOR, AND DISPLAY APPARATUS

(71) Applicants: Chengdu BOE Optoelectronics Technology Co., Ltd., Sichuan (CN); BOE Technology Group Co., Ltd., Beijing (CN)

(72) Inventors: Haigang Qing, Beijing (CN); Yunsheng Xiao, Beijing (CN); Quanyong Gu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/272,814

(22) PCT Filed: Dec. 22, 2021

(86) PCT No.: PCT/CN2021/140561
§ 371 (c)(1),
(2) Date: Jul. 18, 2023

(87) PCT Pub. No.: WO2023/115400
PCT Pub. Date: Jun. 29, 2023

(65) Prior Publication Data
US 2024/0087536 A1    Mar. 14, 2024

(51) Int. Cl.
*G09G 3/3266* (2016.01)
*G09G 3/32* (2016.01)
*G11C 19/28* (2006.01)

(52) U.S. Cl.
CPC ............. *G09G 3/3266* (2013.01); *G09G 3/32* (2013.01); *G11C 19/28* (2013.01);
(Continued)

(58) Field of Classification Search
CPC .............. G09G 2310/0286; G09G 2300/0426
See application file for complete search history.

(56) References Cited

U.S. PATENT DOCUMENTS 9,208,734 B2 * 12/2015 Qian ..................... G11C 19/28
11,468,922 B2 * 10/2022 Zheng .................. G11C 19/28
(Continued)

FOREIGN PATENT DOCUMENTS

CN    103915049 A    7/2014
CN    104795106 A    7/2015
(Continued)

OTHER PUBLICATIONS

International Search Report for PCT/CN2021/140561 Mailed Sep. 27, 2022.

*Primary Examiner* — Patrick F Marinelli
(74) *Attorney, Agent, or Firm* — Ling Wu; Stephen Yang; Ling and Yang Intellectual Property

(57) ABSTRACT

A display substrate, and a display apparatus corresponding thereto and a manufacturing method therefor. The display substrate comprises: a display region and a non-display region, wherein the non-display region is provided with a gate driving circuit, which comprises a plurality of cascaded shift register units. Each shift register unit comprises: an input circuit (10), a first control circuit (11), a second control circuit (12) and an output circuit (15), wherein the first control circuit (11) is located between the input circuit (10) and the output circuit (15) in a first direction, and the first control circuit (11) is arranged in the first direction; and the second control circuit (12) is adjacent to the first control circuit (11) in a second direction; the first direction intersects with the second direction.

17 Claims, 10 Drawing Sheets

(52) U.S. Cl.
CPC ............... *G09G 2300/0426* (2013.01); *G09G 2310/0267* (2013.01); *G09G 2310/0286* (2013.01)

(56) References Cited

U.S. PATENT DOCUMENTS

| | | | | |
|---|---|---|---|---|
| 11,475,826 | B2* | 10/2022 | Li | G09G 3/3266 |
| 11,699,397 | B2* | 7/2023 | Dai | G09G 3/3266 345/55 |
| 11,776,481 | B2* | 10/2023 | Li | G09G 3/3266 345/204 |
| 11,875,749 | B2* | 1/2024 | Yu | G11C 19/28 |
| 2016/0329015 | A1* | 11/2016 | Ji | G09G 3/32 |
| 2018/0069031 | A1* | 3/2018 | Wu | G09G 3/348 |
| 2018/0240382 | A1* | 8/2018 | Choi | G09G 3/3696 |
| 2019/0130857 | A1* | 5/2019 | Ma | G11C 19/28 |
| 2019/0295673 | A1* | 9/2019 | Umezaki | G11C 19/184 |
| 2019/0304374 | A1 | 10/2019 | Wang et al. | |
| 2019/0318693 | A1 | 10/2019 | Jung et al. | |
| 2020/0052005 | A1 | 2/2020 | Yoshida | |
| 2020/0066209 | A1* | 2/2020 | Zhang | G11C 19/28 |
| 2021/0174846 | A1* | 6/2021 | Zheng | G11C 7/1078 |
| 2021/0193007 | A1* | 6/2021 | Cheng | G09G 3/3266 |
| 2021/0312869 | A1* | 10/2021 | Dai | G09G 3/3266 |
| 2021/0335266 | A1* | 10/2021 | Feng | G09G 3/20 |
| 2021/0366354 | A1* | 11/2021 | Li | G09G 3/3266 |
| 2021/0407405 | A1 | 12/2021 | Liu | |
| 2022/0051628 | A1* | 2/2022 | Dai | G09G 3/3266 |
| 2022/0301476 | A1* | 9/2022 | Jin | G09G 3/3266 |
| 2022/0302240 | A1 | 9/2022 | Zhang et al. | |
| 2022/0319374 | A1* | 10/2022 | Xu | G09G 3/20 |
| 2022/0319434 | A1* | 10/2022 | Yu | G09G 3/3266 |
| 2022/0343854 | A1* | 10/2022 | Li | G11C 19/28 |
| 2022/0367730 | A1 | 11/2022 | Qian et al. | |
| 2022/0383820 | A1 | 12/2022 | Zeng et al. | |
| 2022/0406244 | A1* | 12/2022 | Han | G09G 3/32 |
| 2023/0012488 | A1* | 1/2023 | Ma | G09G 3/3674 |
| 2023/0169917 | A1* | 6/2023 | Xiao | G09G 3/3266 345/204 |
| 2023/0245623 | A1* | 8/2023 | Dai | G09G 3/3266 345/55 |
| 2023/0260462 | A1* | 8/2023 | Chen | G11C 19/28 345/214 |
| 2023/0298500 | A1* | 9/2023 | Qing | G09G 3/3266 345/213 |
| 2023/0317015 | A1* | 10/2023 | Chen | H10K 59/1315 345/204 |
| 2023/0410735 | A1* | 12/2023 | Xu | G11C 19/28 |
| 2023/0420064 | A1* | 12/2023 | Zhang | G09G 3/3266 |

FOREIGN PATENT DOCUMENTS

| | | |
|---|---|---|
| CN | 105810166 A | 7/2016 |
| CN | 106782663 A | 5/2017 |
| CN | 108364956 A | 8/2018 |
| CN | 209265989 U | 8/2019 |
| CN | 110767665 A | 2/2020 |
| CN | 111063306 A | 4/2020 |
| CN | 111243650 A | 6/2020 |
| CN | 111508974 A | 8/2020 |
| CN | 112771601 A | 5/2021 |
| CN | 113053293 A | 6/2021 |
| CN | 113160766 A | 7/2021 |
| KR | 20190121419 A | 10/2019 |

* cited by examiner

DISPLAY SUBSTRATE AND MANUFACTURING METHOD THEREFOR, AND DISPLAY APPARATUS

CROSS-REFERENCE TO RELATED APPLICATIONS

The present application is a U.S. National Phase Entry of International Application PCT/CN2021/140561 having an international filing date of Dec. 22, 2021, and the contents disclosed in the above-mentioned application are hereby incorporated as a part of this application.

TECHNICAL FIELD

The present disclosure relates to, but is not limited to, the field of display technologies, and particularly to a display substrate and a preparing method thereof, and a display apparatus.

BACKGROUND

An Organic Light Emitting Diode (OLED) and a Quantum dot Light Emitting Diode (QLED) are active light emitting display devices and have advantages of self-illumination, a wide viewing angle, a high contrast ratio, low power consumption, an extremely high reaction speed, lightness and thinness, bendability, and a low cost, etc. With the continuous development of display technology, a display apparatus using an OLED or a QLED as a light emitting device and a Thin Film Transistor (TFT) for signal control has become a mainstream product in the field of display at present.

SUMMARY

The following is a summary of subject matters described herein in detail. The summary is not intended to limit the protection scope of claims.

Embodiments of the present disclosure provide a display substrate and a preparing method thereof, and a display apparatus.

In one aspect, an embodiment of the present disclosure provides a display substrate, including a display region and a non-display region. The non-display region is provided with a gate drive circuit. The gate drive circuit includes a plurality of cascaded shift register units. The shift register unit includes an input circuit, a first control circuit, a second control circuit, and an output circuit. The input circuit is electrically connected with a first node, and the output circuit is electrically connected with a second node. The first control circuit is electrically connected to the first node, the second node, and the third node, and is configured to control the voltage of the second node under the control of the first node and the third node. The second control circuit is electrically connected to the first node and the third node, and is configured to control the voltage of the third node under the control of the first node. The first control circuit is located between the input circuit and the output circuit in the first direction and is arranged along the first direction, and the second control circuit is adjacent to the first control circuit in the second direction. Among them, the first direction intersects with the second direction.

In some exemplary implementations, the input circuit, the first control circuit, and the second control circuit are all electrically connected to a first connection electrode extending along the first direction to achieve an electrical connection to the first node.

In some exemplary implementations, an orthographic projection of the first connection electrode on the base substrate is located between the first control circuit and the second control circuit in the second direction.

In some exemplary implementations, the first control circuit includes a second transistor and a third transistor, wherein the active layers of the second transistor and the third transistor are of an integral structure and extend along the first direction.

In some exemplary implementations, the second control circuit at least includes a seventh transistor, wherein the control electrodes of the second transistor and the seventh transistor are of an integral structure and extend along the second direction.

In some exemplary implementations, the active layers of the second transistor and the seventh transistor are of an integral structure and form an U shape, and an opening of the U shape faces the input circuit.

In some exemplary implementations, the second control circuit further includes a first capacitor, wherein the first capacitor is located in the second direction on a side of the seventh transistor away from the first control circuit.

In some exemplary implementations, the first capacitor includes a first electrode plate and a second electrode plate, wherein the second electrode plate is located on a side of the first electrode plate away from the base substrate. The first electrode plate has a first connection portion extending along the second direction, and the second electrode plate has a second connection portion extending along the second direction. An orthographic projection of the first connection portion and the second connection portion on the base substrate is overlapped with an orthographic projection of the first connection electrode on the base substrate.

In some exemplary implementations, one of the electrode plates of the first capacitor is electrically connected to a second clock signal line and a second connection electrode. The second connection electrode has a first body and at least two first extension portions extending from the first body along the first direction. The output circuit is electrically connected with an output terminal which is electrically connected with a third connection electrode having a second body and at least two second extension portions extending from the second body along the first direction. The first extension portion and the second extension portion are interspersed with each other.

In some exemplary implementations, the second and third connection electrodes are arranged in the same layer and are located on a side of the first capacitor away from the base substrate.

In some exemplary implementations, the second body of the third connection electrode is electrically connected to a cascaded signal line adjacent to the output circuit in the second direction and extending along the first direction.

In some exemplary implementations, the output circuit at least includes a fifth transistor and a second capacitor. The fifth transistor is electrically connected with the second capacitor; the second capacitor is adjacent to the fifth transistor in the first direction and is located on a side of the fifth transistor adjacent to the second control circuit. The orthographic projection of the first body of the second connection electrode on the base substrate is overlapped with an orthographic projection of the second capacitor on the base substrate.

In some exemplary implementations, the shift register unit further includes a third control circuit, wherein the third control circuit is electrically connected with the first node, the second node, the second clock signal line, and the first power supply line, and is configured to transmit a first voltage signal provided by the first power supply line to the first node under the control of the second node and the second clock signal line. The third control circuit is located between the first control circuit and the output circuit in the first direction, and the third control circuit is arranged along the second direction.

In some exemplary implementations, the first control circuit, the second control circuit, and the third control circuit are all electrically connected to a fourth connection electrode extending long the second direction to achieve an electrical connection to the second node.

In some exemplary implementations, the third control circuit is electrically connected to the first control circuit, the second control circuit, and the input circuit through a first connection electrode extending along the first direction.

In some exemplary implementations the third control circuit includes a sixth transistor and a ninth transistor, wherein the active layers of the sixth transistor and the ninth transistor are of an integral structure and extend along the second direction.

In some exemplary implementations, the first control circuit, the second control circuit, and the third control circuit are electrically connected to the first power supply line through a power supply connection electrode. The first power supply line is located on a side of the output circuit away from the third control circuit in the first direction, and the power connection electrode is located on a side of the third control circuit away from the first connection electrode.

In some exemplary implementations, the first power supply line and the power supply connection electrode are of an integral structure, and the power supply connection electrode and the first connection electrode are arranged in the same layer.

In some exemplary implementations, the shift register unit further includes a fourth control circuit, wherein the fourth control circuit is electrically connected with the first node and the output circuit. The fourth control circuit is adjacent to the input circuit in the second direction.

In some exemplary implementations, the fourth control circuit is electrically connected to a second power supply line; and in the first direction, the fourth control circuit and the input circuit are both adjacent to the second power supply line.

In some exemplary implementations, a first clock signal line, a second clock signal line, and a start signal line are sequentially arranged in the first direction and along a direction of the second power supply line away from the input circuit.

In another aspect, an embodiment of the present disclosure provides a display apparatus, comprising the display substrate described above.

In another aspect, an embodiment of the present disclosure provides a preparation method of a display substrate, used for preparing the aforementioned display substrate, comprising providing a base substrate; and forming a gate drive circuit in a non-display region. Among them, the gate drive circuit includes a plurality of cascaded shift register units. The shift register unit includes an input circuit, a first control circuit, a second control circuit, and an output circuit. The input circuit is electrically connected with a first node, and the output circuit is electrically connected with a second node. The first control circuit is electrically connected to the first node, the second node, and the third node, and is configured to control the voltage of the second node under the control of the first node and the third node. The second control circuit is electrically connected to the first node and the third node, and is configured to control the voltage of the third node under the control of the first node. The first control circuit is located between the input circuit and the output circuit in the first direction, and the first control circuit is arranged along the first direction. The second control circuit is adjacent to the first control circuit in the second direction. The first direction intersects with the second direction.

Other aspects may be understood upon reading and understanding the drawings and detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure, but do not constitute limitations on the technical solutions of the present disclosure. Shapes and sizes of one or more components in the drawings do not reflect true scales, and are only intended to schematically describe contents of the present disclosure.

DETAILED DESCRIPTION

Figure 1:
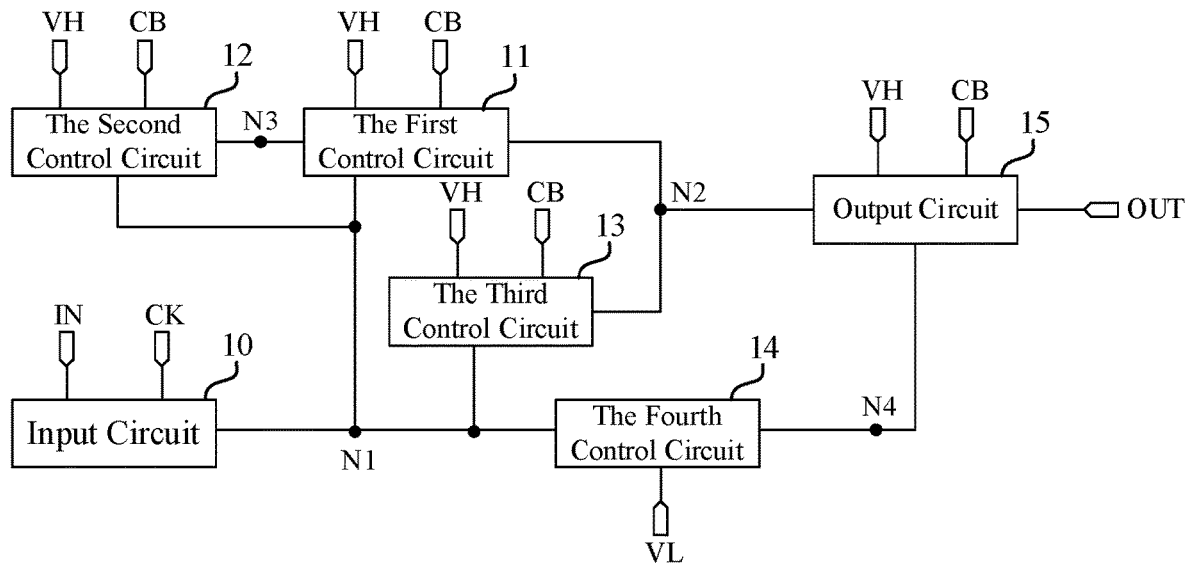
FIG. 1 is a schematic diagram of a structure of a shift register unit according to at least one embodiment of the present disclosure.

The embodiments of the present disclosure will be described below in combination with the drawings in detail. Implementation modes may be implemented in a plurality of different forms. Those of ordinary skills in the art may easily understand such a fact that implementation modes and contents may be transformed into one or more forms without departing from the purpose and scope of the present disclosure. Therefore, the present disclosure should not be explained as being limited to contents described in following implementation modes only. The embodiments in the present disclosure and features in the embodiments may be combined randomly with each other without conflict.

In the drawings, a size of one or more constituent elements, a thickness of a layer, or a region is sometimes exaggerated for clarity. Therefore, one mode of the present disclosure is not necessarily limited to the size, and a shape and a size of one or more components in the drawings do not reflect a true proportion. In addition, the drawings schematically illustrate ideal examples, and one mode of the present disclosure is not limited to shapes, numerical values, or the like shown in the drawings.

Ordinal numerals such as "first", "second" and "third" in the present disclosure are set to avoid confusion of constituent elements, but not intended for restriction in quantity. In the present disclosure, "plurality" represents two or more than two.

In the present disclosure, for convenience, wordings "central", "up", "down", "front", "back", "vertical", "horizontal", "top", "bottom", "inside", "outside" and the like indicating orientation or positional relationships are used to illustrate positional relationships between constituent elements with reference to the drawings, which are only to facilitate describing the present specification and simplify the description, rather than indicating or implying that involved devices or elements must have specific orientations and be structured and operated in the specific orientations, and thus should not be understood as limitations on the present disclosure. The positional relationships between the constituent elements are changed as appropriate based on directions for describing the constituent elements. Therefore, appropriate replacements may be made according to situations without being limited to the wordings described in the specification.

In the present disclosure, unless otherwise specified and defined, terms "mounting", "mutual connection" and "connection" should be understood in a broad sense. For example, it may be a fixed connection, or a detachable connection, or an integrated connection. It may be a mechanical connection or an electrical connection. It may be a direct mutual connection, or an indirect connection through middleware, or internal communication between two components. Those of ordinary skills in the art may understand meanings of the above-mentioned terms in the present disclosure according to situations. An "electrical connection" includes a case where constituent elements are connected together through an element with a certain electrical action. The "element having some electrical function" is not particularly limited as long as electrical signals between the connected constituent elements may be transmitted. Examples of "an element with a certain electrical action" not only include electrodes and wirings, but also include switching elements such as transistors, resistors, inductors, capacitors, other elements with one or more functions, etc.

In the present disclosure, a transistor refers to an element at least including three terminals, i.e., a gate electrode (gate), a drain electrode, and a source electrode. The transistor has a channel region between the drain electrode (drain electrode terminal, drain region, or drain) and the source electrode (source electrode terminal, source region, or source), and a current can flow through the drain electrode, the channel region, and the source electrode. In the present disclosure, the channel region refers to a region through which a current mainly flows.

In the present disclosure, to distinguish two electrodes of a transistor except a gate electrode, one of the electrodes is referred to as a first electrode and the other electrode is referred to as a second electrode. The first electrode may be a source electrode or a drain electrode, and the second electrode may be a drain electrode or a source electrode. In addition, the gate electrode of the transistor is referred to as a control electrode. In cases that transistors with opposite polarities are used, a current direction changes during operation of a circuit, or the like, functions of the "source electrode" and the "drain electrode" are sometimes interchangeable. Therefore, the "source electrode" and the "drain electrode" are interchangeable in the present disclosure.

In the present disclosure, "parallel" refers to a state in which an angle formed by two straight lines is −10° or more and 10° or less, and thus may include a state in which the angle is −5° or more and 5° or less. In addition, "perpendicular" refers to a state in which an angle formed by two straight lines is 80° or more and 100° or less, and thus may include a state in which the angle is 85° or more and 95° or less.

In the present disclosure, "film" and "layer" are interchangeable. For example, a "conductive layer" may be replaced with a "conductive film" sometimes. Similarly, an "insulation film" may be replaced with an "insulation layer" sometimes.

In the present disclosure, "about" and "substantially" refer to that a boundary is not defined strictly and a case within a range of a process and measurement error is allowed.

An embodiment of the present disclosure provides a display substrate, including a display region and a non-display region. The non-display region is provided with a gate drive circuit. The gate drive circuit includes a plurality of cascaded shift register units. The shift register unit includes an input circuit, a first control circuit, a second control circuit, and an output circuit. The input circuit is electrically connected with a first node, and the output circuit is electrically connected with a second node. The first control circuit is electrically connected to the first node, the second node, and the third node, and is configured to control the voltage of the second node under the control of the first node and the third node. The second control circuit is electrically connected to the first node and the third node, and is configured to control the voltage of the third node under the control of the first node. The first control circuit is located between the input circuit and the output circuit in the first direction, and the first control circuit is arranged along the first direction. The second control circuit is adjacent to the first control circuit in the second direction. Herein, the first direction and the second direction intersect. For example, the first direction and the second direction may be perpendicular to each other. However, this embodiment is not limited thereto.

The display substrate provided in this embodiment arranges the first control circuit arranged along the first direction between the input circuit and the output circuit, and arranges the first control circuit to be adjacent to the second control circuit in the second direction, which is advantageous to sharing arrangements of traces of the first node and the second node and reduces the trace space, thus optimizing the space layout of the shift register unit, and saving the space occupied by the shift register unit. For example, it is beneficial to achieve a display substrate with a narrow bezel design.

In some exemplary implementations, the input circuit, the first control circuit, and the second control circuit are all electrically connected to a first connection electrode extending along the first direction to achieve an electrical connection to the first node. In the present example, the electrical connection of the input circuit, the first control circuit, and the second control circuit to the first node is achieved through the first connection electrode extending along the first direction, which may save the wiring occupation space.

In some exemplary implementations, an orthographic projection of the first connection electrode on the base substrate is located between the first control circuit and the second control circuit in the second direction. In this example, the first connection electrode is arranged between the first control circuit and the second control circuit along the second direction, so that the arrangement of the trace may be optimized and the wiring occupation space may be saved.

In some exemplary implementations, the first control circuit includes a second transistor and a third transistor. The active layers of the second transistor and the third transistor are of an integral structure and extend along the first direction. In the present example, the second transistor and the third transistor are arranged along the first direction, which is beneficial to the common arrangement of the traces of the second nodes, thereby reducing the wiring space.

In some exemplary implementations, the second control unit at least includes a seventh transistor. The control electrodes of the second transistor and the seventh transistor are of an integral structure and extend along the second direction. In some examples, the active layers of the second transistor and the seventh transistor are of an integral structure and are U-shaped, and the U-shaped opening faces the input circuit. In this example, the second transistor and the seventh transistor are arranged along the second direction, which is beneficial to the common arrangement of the traces of the first node, thereby saving space.

In some exemplary implementations, the second control circuit further includes a first capacitor. The first capacitor is located on a side of the seventh transistor away from the first control circuit in the second direction. In this example, the seventh transistor and the first capacitor are arranged sequentially in the second direction, which is beneficial to optimize the spatial layout of the shift register unit and save the space occupied by the shift register unit.

In some exemplary implementations, the first capacitor includes a first electrode plate and a second electrode plate. The second electrode plate is located on a side of the first electrode plate away from the base substrate. The first electrode plate has a first connection portion extending along the second direction, and the second electrode plate has a second connection portion extending along the second direction. The orthographic projections of the first connection portion and the second connection portion on the base substrate is not overlapped, and the orthographic projections of the first connection portion and the second connection portion on the base substrate is overlapped with an orthographic projections of the first connection electrode on the base substrate. In this example, the electrical connection with the first control circuit is achieved through the connection portions of the two electrode plates of the first capacitor, which may optimize the spatial layout of the shift register unit, and may save the space occupied by the shift register unit.

In some exemplary implementations, one of the electrode plates of the first capacitor is electrically connected to a second clock signal line and a second connection electrode. The second connection electrode has a first body and at least two first extension portions extending from the first body along the first direction. The output circuit is electrically connected with an output terminal, which is electrically connected with a third connection electrode. The third connection electrode has a second body and at least two second extension portions extending from the second body along the first direction. The at least two first extensions and the at least two second extensions are interspersed with each other. In some examples, the second and third connection electrodes are arranged in the same layer and are located on a side of the first capacitor away from the base substrate. In this example, the second connection electrode transmits a second clock signal, and the third connection electrode transmits an output signal. The first extension portion and the second extension portion are arranged to be interspersed with each other, which may optimize the arrangement of signal traces, thereby saving the space occupied by the shift register unit.

In some exemplary implementations, the output circuit at least includes a fifth transistor and a second capacitor. The fifth transistor is electrically connected to the second capacitor. The second capacitor is adjacent to the fifth transistor in the first direction and is located on a side of the fifth transistor close to the second control circuit. An orthographic projection of the first body of the second connection electrode on the base substrate is overlapped with an orthographic projection of the second capacitor on the base substrate. In this example, the arrangement of second connection electrode and the second capacitor are partially overlapped, which may achieve a better space utilization.

In some exemplary implementations, the shift register unit may further include a third control circuit. The third control circuit is electrically connected to a first node, the second node, a second clock signal line, and a first power supply line, and is configured to transmit a first voltage signal provided by the first power supply line to the first node under the control of the second node and the second clock signal line. The third control circuit is located between the first control circuit and the output circuit in the first direction, and the third control circuit is arranged along the second direction. In this example, the arrangement of the third control circuit is beneficial to sharing the arrangement of the trace of the first node and to sharing the arrangement of the trace of the second node, which may reduce the wiring space.

In some exemplary implementations, the first control circuit, the second control circuit, and the third control circuit are all electrically connected to a fourth connection electrode extending long the second direction to achieve an electrical connection to the second node. In the present example, the electrical connection of the first control circuit, the second control circuit, and the third control circuit to the second node is achieved by the fourth connection electrode extending along the second direction, which may save the wiring occupation space.

In some exemplary implementations, the shift register unit further includes a fourth control circuit. The fourth control circuit is electrically connected with the first node and the output circuit. The fourth control circuit is adjacent to the input circuit in the second direction. In this example, the arrangement of the fourth control circuit is beneficial to the common arrangement of the traces of the first node.

Solutions of the embodiments will be described below through some examples.

In some exemplary implementations, the display substrate may include: a display region and a non-display region. For example, the non-display region may be located at a periphery of the display region. However, this embodiment is not limited thereto. For example, a non-display region may be located between adjacent display regions.

In some exemplary implementations, the display region at least includes a plurality of regularly arranged pixel circuits, a plurality of gate lines (for example, including a scan line, a reset signal line, and a light emitting control line) extending along the first direction, a plurality of data lines extending along the second direction, and a power supply line. The first direction and the second direction may be located in a same plane, and the first direction interacts with the second direction, for example, the first direction may be perpendicular to the second direction.

In some exemplary implementations, a pixel unit in the display region may include three sub-pixels, and the three sub-pixels may be a red sub-pixel, a green sub-pixel, and a blue sub-pixel respectively. However, this embodiment is not limited thereto. In some examples, a pixel unit may include four sub-pixels, wherein the four sub-pixels are respectively a red sub-pixel, a green sub-pixel, a blue sub-pixel, and a white sub-pixel.

In some exemplary implementations, a shape of a sub-pixel may be a rectangle, a rhombus, a pentagon, or a hexagon. When a pixel unit includes three sub-pixels, the three sub-pixels may be arranged side by side horizontally, side by side vertically, or in a shape of a Chinese character "品". When a pixel unit includes four sub-pixels, the four sub-pixels may be arranged side by side horizontally, side by side vertically, or in a shape of a square. However, this embodiment is not limited thereto.

In some exemplary implementations, a timing controller, a data drive circuit, and a gate drive circuit may be arranged in the non-display region. The gate drive circuit may be arranged on two opposite sides of the display region respectively, such as left and right sides of the display region. The timing controller and the data drive circuit may be arranged on a side of the display region, such as a lower side of the display region. However, this embodiment is not limited thereto.

In some exemplary implementations, the data drive circuit may provide a data signal to a sub-pixel through a data line. The gate drive circuit may provide a scan signal to a sub-pixel through a scan line, and provide a reset signal to a sub-pixel through a reset signal line, or provide a light emitting control signal to a sub-pixel through a light emitting control line. The timing controller may provide drive signals to the data drive circuit and the gate drive circuit. Actions of the gate drive circuit and the data drive circuit may be controlled by the timing controller. The timing controller may provide gray scale data specifying a gray scale that should be displayed at a sub-pixel to the data drive circuit. The data drive circuit may provide a data signal of a potential corresponding to the gray scale data of the sub-pixel to sub-pixels of a row selected by the gate drive circuit via a data line.

In some exemplary implementations, the pixel drive circuit may have a structure of 3T1C, 4T1C, 5T1C, 5T2C, 6T1C, 7T1C, 8T1C or 8T2C. However, this embodiment is not limited thereto. For example, the pixel drive circuit may include an N-type transistor and a P-type transistor. The N-type transistor may be, for example, an oxide thin film transistor and the P-type transistor may be, for example, a Low Temperature Poly Silicon thin film transistor. An active layer of a Low Temperature Poly Silicon thin film transistor is made of Low Temperature Poly Silicon (LTPS), and an active layer of an oxide thin film transistor is made of an oxide semiconductor (Oxide). A Low-temperature Poly Silicon thin film transistor has advantages such as a high mobility rate and fast charging, while an oxide thin film transistor has an advantage such as a low leakage current. The Low Temperature Poly Silicon thin film transistor and the oxide thin film transistor are integrated on one display substrate to form a Low Temperature Polycrystalline Oxide (LTPO) display substrate, and advantages of both the Low Temperature Poly Silicon thin film transistor and the oxide thin film transistor may be utilized, which may achieve low-frequency drive, reduce power consumption, and improve display quality.

In some exemplary implementations, the gate drive circuit includes a plurality of cascaded shift register units. For example, an input terminal of a first stage shift register unit may be connected with a start signal line, and an output terminal of an i-th stage shift register unit may be connected with an input terminal of an (i+1)-th stage shift register unit to provide an input signal to the (i+1)-th stage shift register unit, wherein i is a positive integer. An output terminal of a shift register unit may further provide a scan signal to a sub-pixel through a scan line or provide a reset signal to a sub-pixel through a reset signal line. However, this embodiment is not limited thereto.

FIG. 1 is a schematic diagram of a structure of a shift register unit according to at least one embodiment of the present disclosure. In some exemplary implementations, as shown in FIG. 1, the shift register unit provided in the present embodiment may include an input circuit 10, an output circuit 15, a first control circuit 11, a second control circuit 12, a third control circuit 13, and a fourth control circuit 14.

In some exemplary implementations, as shown in FIG. 1, the input circuit 10 is electrically connected to an input terminal IN, a first clock terminal CK, and a first node N1, and is configured to transmit the input signal received by the input terminal IN to the first node N1 under the control of the first clock signal transmitted by the first clock terminal CK. The first control circuit 11 is electrically connected to a first node N1, a second node N2, a third node N3, the first power supply terminal VH, and the second clock terminal CB, and is configured to control a voltage of the second node N2 under the control of the third node N3 and the first node N1. The second control circuit 12 is electrically connected to the first node N1, the third node N3, the first power supply terminal VH and the second clock terminal CB, and is configured to control a voltage of the third node N3 under the control of the second clock signal transmitted by the first node N1 and the second clock terminal CB. The third control circuit 13 is electrically connected to the first node N1, the second node N2, the first power supply terminal VH, and the second clock terminal CB, and is configured to transmit a first voltage signal provided by the first power supply terminal VH to the first node N1 under the control of the second clock signal transmitted by the second node N2 and the second clock terminal CB. The fourth control circuit 14 is electrically connected to the first node N1, the fourth node N4 and a second power supply terminal VL, and is configured to transmit an input signal from the first node N1 to the fourth node N4 and stabilize a voltage of the fourth node N4 under the control of the second voltage signal transmitted by the second power supply terminal VL. The output circuit 15 is electrically connected with the second node N2, the fourth node N4, an output terminal OUT, the first power supply terminal VH and the second clock terminal CB, and is configured to transmit a first voltage signal transmitted by the first power supply terminal VH to the output terminal OUT under the control of the second node N2, or to transmit a second clock signal transmitted by the second clock terminal CB to the output terminal OUT under the control of the fourth node N4.

In some exemplary implementations, the first power supply terminal VH may keep providing first voltage signals with a high level, and the second power supply terminal VL may keep providing second voltage signals with a low level. The first voltage signal provided by the first power supply terminal VH is greater than a second voltage signal provided by the second power supply terminal VL. However, this embodiment is not limited thereto.

The "high level" and "low level" mentioned herein are relative, and the voltage values of "high level" and "low level" are not limited.

In the shift register unit provided in this embodiment, when the voltage of the first node N1 is at a low level, the voltage of the second node N2 is at a high level; and when the voltage of the second node N2 is at a low level, the voltage of the first node N1 is at a high level. In this way, in a process of the output circuit 15 transmitting the second clock signal to the output terminal OUT, it may avoid transmitting the first voltage signal to the output terminal OUT, and in a process of the first voltage signal being transmitted to the output terminal OUT, it may avoid transmitting the second clock signal to the output terminal OUT, which may thus avoid affecting the accuracy of the output signal. Furthermore, the third control circuit 13 is provided, which may make the voltage of the first node N1 be at a high level when the voltage of the second node N2 is at a low level, so that the third node N3 is in a floating state, which makes the voltage of the third node N3 be controlled by the second clock signal. In this way, the situation that the second control circuit 12 mistakenly transmits the first voltage signal of the high level to the third node N3 and the situation that the first control circuit 11 mistakenly transmits the first voltage signal of the high level to the second node N2 may be avoided, which is beneficial to ensuring that the voltage of the second node N2 is kept at a low level, and further to ensuring that the output circuit 15 stably outputs the first voltage signal. In addition, the fourth control circuit 14 is provided, which may prevent the fourth node N4 from leaking through the input circuit 10, thereby making the voltage of the fourth node N4 more stable and further making the output circuit 15 have a more stable turn-on state, and which may make the voltage of the first node N1 more controllable and stable, thereby preventing the operation performance of the input circuit 10 and the third control circuit 13 from being affected by a large change in the voltage of the first node N1.

Figure 2:
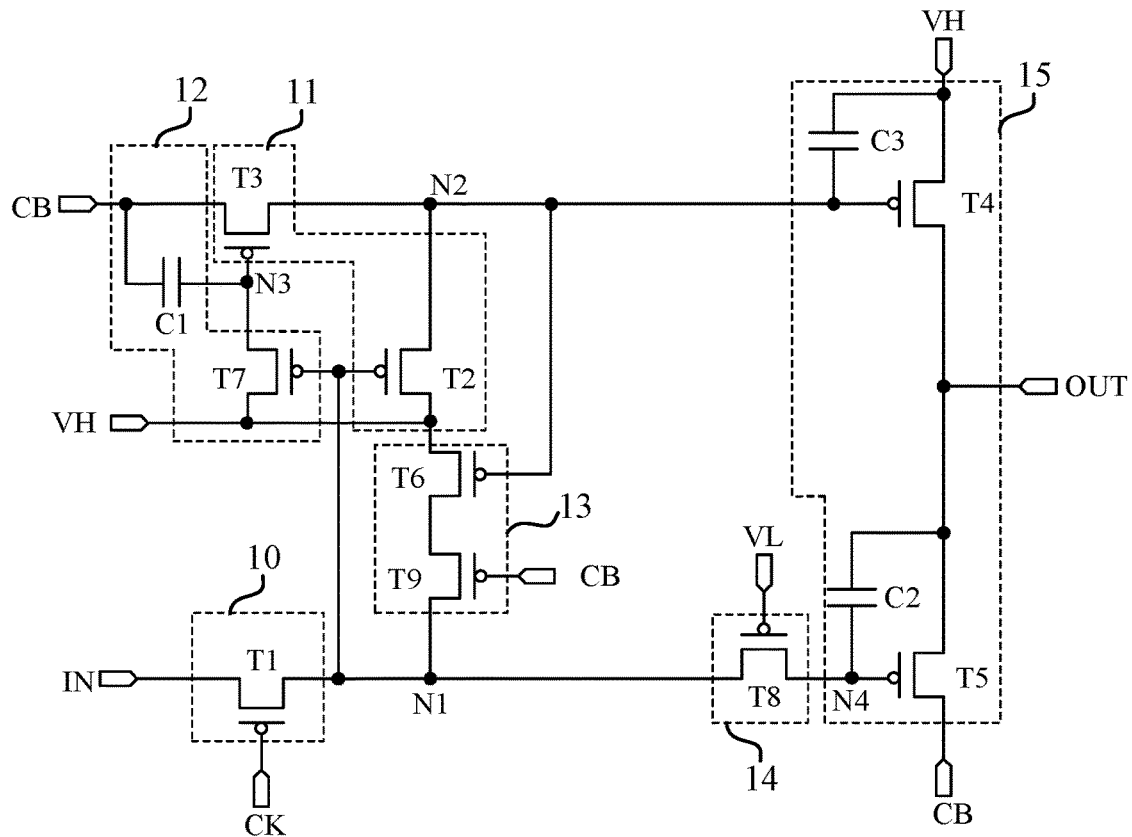
FIG. 2 is an equivalent circuit diagram of a shift register unit in accordance with at least one embodiment of the present disclosure.

FIG. 2 is an equivalent circuit diagram of a shift register unit according to at least one embodiment of the present disclosure. As shown in FIG. 2, the input circuit 10 includes a first transistor T1. A control electrode of the first transistor T1 is electrically connected with the first clock terminal CK, a first electrode of the first transistor T1 is electrically connected with the input terminal IN, and a second electrode of the first transistor T1 is electrically connected with a first node N1.

As shown in FIG. 2, the first control circuit 11 includes a second transistor T2 and a third transistor T3. A control electrode of the second transistor T2 is electrically connected to the first node N1, a first electrode of the second transistor T2 is electrically connected to the first power supply terminal VH, and a second electrode of the second transistor T2 is electrically connected to the second node N2. A control electrode of the third transistor T3 is electrically connected to the third node N3, a first electrode of the third transistor T3 is electrically connected to the second clock terminal CB, and a second electrode of the third transistor T3 is electrically connected to the second node N2.

As shown in FIG. 2, the second control circuit 12 includes a seventh transistor T7 and a first capacitor C1. A control electrode of the seventh transistor T7 is electrically connected to the first node N1, a first electrode of the seventh transistor T7 is electrically connected to the first power supply terminal VH, and a second electrode of the seventh transistor T7 is electrically connected to the third node N3. A first electrode plate of the first capacitor C1 is electrically connected to the third node N3, and a second electrode plate of the first capacitor C1 is electrically connected to the second clock terminal CB.

As shown in FIG. 2, the third control circuit 13 includes a sixth transistor T6 and a ninth transistor T9. A control electrode of the sixth transistor T6 is electrically connected with the second node N2, a first electrode of the sixth transistor T6 is electrically connected with the first power supply terminal VH, and a second electrode of the sixth transistor T6 is electrically connected with a first electrode of the ninth transistor T9. A control electrode of the ninth transistor T9 is electrically connected with the second clock terminal CB, and a second electrode of the ninth transistor T9 is electrically connected with the first node N1.

As shown in FIG. 2, the fourth control circuit 14 includes an eighth transistor T8. A control electrode of the eighth transistor T8 is electrically connected to the second power supply terminal VL, a first electrode of the eighth transistor T8 is electrically connected to the first node N1, and a second electrode of the eighth transistor T8 is electrically connected to the fourth node N4.

As shown in FIG. 2, the output circuit 15 includes a fourth transistor T4, a fifth transistor T5, a second capacitor C2 and a third capacitor C3. A control electrode of the fourth transistor T4 is electrically connected with the second node N2, a first electrode of the fourth transistor T4 is electrically connected with a first power supply terminal VH, and a second electrode of the fourth transistor T4 is electrically connected with an output terminal OUT. A control electrode of the fifth transistor T5 is electrically connected with a fourth node N4, a first electrode of the fifth transistor T5 is electrically connected with a second clock terminal CB, and a second electrode of the fifth transistor T5 is electrically connected with the output terminal OUT. The first electrode plate of the second capacitor C2 is electrically connected to the fourth node N4, and the second electrode plate of the second capacitor C2 is electrically connected to the output terminal OUT. A first electrode plate of the third capacitor C3 is electrically connected to the second node N2, and a second electrode plate of the third capacitor C3 is electrically connected to the first power supply terminal VH. In this example, the fourth transistor T4 and the fifth transistor T5 are output transistors.

In the present exemplary implementation, the first node N1 is a connection point of the first transistor T1, the second transistor T2, the seventh transistor T7, the ninth transistor T9 and the eighth transistor T8, the second node N2 is a connection point of the second transistor T2, the third transistor T3, the fourth transistor T4 and the sixth transistor T6, the third node N3 is a connection point of the third transistor T3, the seventh transistor T7 and the first capacitor C1, and the fourth node N4 is a connection point of the fifth transistor T5, the eighth transistor T8 and the second capacitor C2.

In the present exemplary implementation, the first node N1, the second node N2, the third node N3, and the fourth node N4 do not represent components that actually exist, but represent junctions of related electrical connections in the circuit diagram. In other words, these nodes are nodes equivalent to the convergence points of related electrical connections in the circuit diagram.

In the present exemplary implementation, FIG. 2 shows an exemplary structure of the first control circuit 11, the second control circuit 12, the third control circuit 13, the fourth control circuit 14, the input circuit 10, and the output circuit 15. Those skilled in the art will readily understand that implementations of the first control circuit, the second control circuit, the third control circuit, the fourth control circuit, the input circuit, and the output circuit are not limited thereto, as long as their functions may be achieved.

Figure 3:
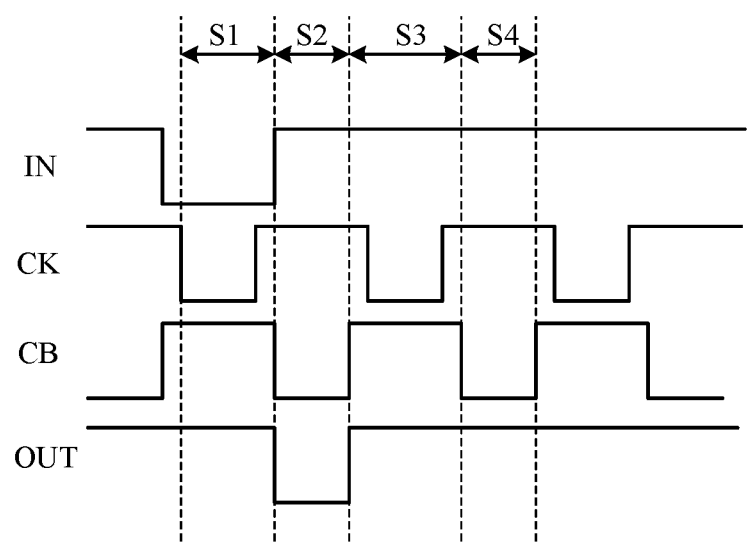
FIG. 3 is a working timing diagram of the shift register unit shown in FIG. 2.

Technical solutions of the embodiments of the present disclosure will be further described below through a working process of a shift register unit. The following description is made by taking a working process of a first stage shift register unit as an example. An input terminal IN of the first stage shift register unit is connected with a start signal line STV. FIG. 3 is a working timing diagram of the shift register unit shown in FIG. 2.

A case that transistors in the shift register unit are all P-type transistors, a first voltage signal provided by the first power supply terminal VH is a high-level voltage, and a second voltage signal provided by the second power supply terminal VL is a low-level voltage, is taken as an example for following description.

As shown in FIG. 3, the driving process of the shift register unit in a row of gate lines provided in the exemplary implementation at least includes following phases: an input stage S1, a scan stage S2, a first holding stage S3, and a second holding stage S4.

In the input stage S1, the input terminal IN provides an input signal with a low level, the first clock terminal CK provides a first clock signal with a low level, and the second clock terminal CB provides a second clock signal with a high level.

In response to the first clock signal, a first transistor T1 in the input circuit 10 is turned on to transmit the input signal to the first node N1, so that the voltage of the first node N1 is at a low level. The second transistor T2 and the seventh transistor T7 are turned on under the control of the voltage of the first node N1. The seventh transistor T7 transmits the first voltage signal to the third node N3, so that the voltage of the third node N3 is at a high level, thereby turning off the third transistor T3. The second transistor T2 transmits the first voltage signal to the second node N2, such that the voltage of the second node N2 is at a high level. The fourth transistor T4 is turned off under the control of the voltage of the second node N2, and the first voltage signal charges the third capacitor C3. The sixth transistor T6 is turned off under the control of the voltage of the second node N2. The ninth transistor T9 is turned off under the control of the second clock signal. The eighth transistor T8 is kept in a turned-on state under the control of the second voltage signal, so that the input signal at the first node N1 may be transmitted to the fourth node N4, which makes the voltage of the fourth node N4 is at a low level and charges the second capacitor C2. Under the control of the voltage of the first node N1 (i.e. the fourth node N4), the fifth transistor T5 in the output circuit 15 is turned on, and the second clock signal is transmitted to the output terminal OUT and output from the output terminal OUT as an output signal. In this stage, the level of the second clock signal is at a high level, so the level of the output signal is at a high level.

In the scan stage S2, the input terminal IN provides an input signal with a high level, the first clock terminal CK provides a first clock signal with a high level, and the second clock terminal CB provides a second clock signal with a low level.

In response to the first clock signal, the first transistor T1 in the input circuit 10 is turned off. The first node N1 has no discharge path and therefore the voltage of the first node N1 keeps substantially unchanged, that is, the voltage of the first node N1 is kept at a low level. The second transistor T2 and the seventh transistor T7 are kept in a turned-on state under the control of the voltage of the first node N1. The voltage of the third node N3 is still at a high level, and the third transistor T3 is kept in a turned-off state. The voltage of the second node N2 is still at a high level, and under the control of the voltage of the second node N2, the fourth transistor T4 is kept in a turned-off state and continuously charges the third capacitor C3. The sixth transistor T6 is kept in a turned-off state under the control of the voltage of the second node N2. The ninth transistor T9 is turned on under the control of the second clock signal. The second capacitor C2 is discharged, so that the voltage of the fourth node N4 is kept at a low level. The fifth transistor T5 is kept in a turned-on state under the control of the voltage of the first node N1 (i.e. the fourth node N4) and continuously transmits the second clock signal to the output terminal OUT. In this stage, the level of the second clock signal is at a low level, so the level of the output signal is at a low level.

In the first holding stage S21, the input terminal IN provides an input signal with a high level, the first clock signal line provided by the first clock terminal CK is kept at a high level and then jumps to a low level, and the second clock terminal CB provides a second clock signal with a high level.

The voltage of the first node N1 and the voltage of the fourth node N4 are kept at a low level until the level of the first clock signal jumps to a low level. Based on this, the voltage of the second node N2 and the voltage of the third node N3 are still kept at a high level. The fifth transistor T5 is kept in a turned-on state and continuously transmits the second clock signal to the output terminal OUT. Since the level of the second clock signal is at a high level, the level of the output signal is at a high level.

After the level of the first clock signal jumps to a low level, the first transistor T1 is turned on in response to the first clock signal, and the input signal is transmitted to the first node N1, so that the voltage of the first node N1 is at a high level. The eighth transistor T8 is kept in a turned-on state under the control of the second voltage signal, which may thus transmit the input signal at the first node N1 to the fourth node N4, so that the voltage of the fourth node N4 is at a high level. This also completes the reset of the first node N1 and the fourth node N4. At the same time, the second capacitor C2 is charged. The fifth transistor T5 is turned off under the control of the voltage of the first node N1 (i.e. the fourth node N4). The second transistor T2 and the seventh transistor T7 are turned off under the control of the voltage of the first node N1. The third node N3 is in a floating state. Since the level of the second clock signal is a high level, the voltage of the third node N3 may become at a high level under the coupling action of the first capacitor C1, thereby keeping the third transistor T3 in a turned-off state. The third capacitor C3 is discharged, so that the voltage of the second node N2 is still kept at a high level. Under the control of the voltage of the second node N2, the fourth transistor T4 is kept in a turned-off state. The sixth transistor T6 is kept in a turned-off state under the control of the voltage of the second node N2.

Since the output terminal OUT of the shift register unit is connected with a load (that is, a pixel circuit in a sub-pixel), the level of the output signal output by the output terminal OUT is the same as that of the stage before the level jump of the first clock signal, that is, the level of the output signal output by the output terminal OUT is kept at a high level.

In the second holding stage S22, the input terminal IN provides an input signal with a high level, the first clock terminal CK provides a first clock signal with a high level, and the second clock terminal CB provides a second clock signal with a low level.

In response to the first clock signal, the first transistor T1 is turned off. The voltage of the first node N1 and the voltage of the fourth node N4 keep substantially unchanged, that is, the voltage of the first node N1 and the voltage of the fourth node N4 keep at a high level. The fifth transistor T5 is kept in a turned-off state under the control of the voltage of the first node N1 (i.e. the fourth node N4). The second transistor T2 and the seventh transistor T7 are kept in a turned-off state under the control of the voltage of the first node N1, so that the third node N3 is kept in a floating state. Since the level of the second clock signal is at a low level, the voltage of the third node N3 may become at a low level under the coupling action of the first capacitor C1, so that the third transistor T3 is turned on. The third transistor T3 transmits a second clock signal to the second node N2, such that the voltage of the second node N2 is at a low level. The sixth transistor T6 is turned on under the control of the voltage of the second node N2, and the ninth transistor T9 is turned on under the control of the second clock signal to transmit the first voltage signal to the first node N1, so that the voltage of the first node N1 is at a high level. Under the control of the voltage of the second node N2 described above, the fourth transistor T4 is turned on to transmit the first voltage signal to the output terminal OUT. The level of the output signal output by the output terminal OUT is at a high level.

During the driving process of the shift register unit, a plurality of S3 stages and S4 stages may be included, which are sequentially and cyclically performed. During this process, the fourth transistor T4 is kept in a turned-on state and continuously transmits the first voltage signal to the output terminal OUT, so that the output terminal OUT continuously outputs an output signal with a high level. Every time the level of the second clock signal jumps from a high level to a low level, the level of the control electrode of the third transistor T3 will be pulled down once by coupling, so that the third transistor T3 will be turned on to transmit the second clock signal to the second node N2, and to charge the third capacitor C3 at the same time, so that the voltage of the second node N2 may be kept at a low level. After the level of the input signal jumps to a low level, this process ends.

The shift register unit of the embodiment only includes nine transistors and three capacitors, so that a signal output may be achieved, and wherein in the S2 stage, after the output terminal outputs the second clock signal with a low level, the first control circuit, the second control circuit and the third control circuit may be used to reset the first node and the fourth node, and in the S3 stage and the S4 stage, the potential of the second node may be controlled by coupling the capacitor with the control electrode of the transistor, so that the output circuit may stably output the first voltage signal with a high level, which is beneficial to improving the accuracy of the output signal.

Figure 4:
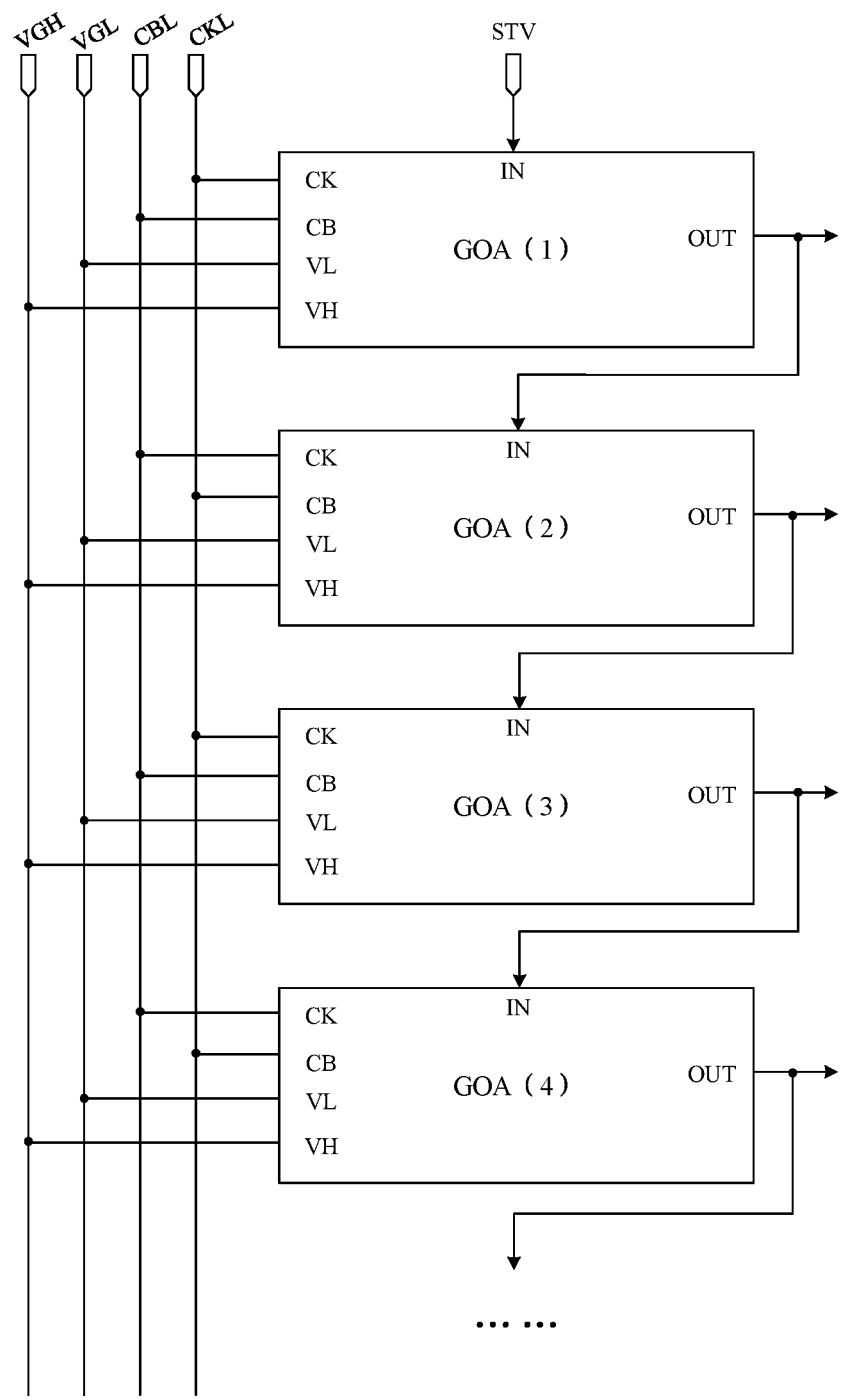
FIG. 4 is a schematic diagram of a gate drive circuit according to at least one embodiment of the present disclosure.

FIG. 4 is a schematic diagram of a gate drive circuit according to at least one embodiment of the present disclosure. In some exemplary implementation, as shown in FIG. 4, the gate drive circuit includes a plurality of cascaded shift register units. An output end of an i-th-stage shift register unit is electrically connected to an input end of an (i+1)-th-stage shift register unit. The output signal of each stage shift register unit except the last shift register unit can be used as the input signal of the next shift register unit, wherein i is a positive integer.

In some exemplary implementations, as shown in FIG. 4, the first clock terminal CK of the (2n−1)-th stage shift register unit GOA (2n−1) is electrically connected to the first clock signal line CKL, and the second clock terminal CB is electrically connected to the second clock signal line CBL. A first clock terminal CK of the 2n-th stage shift register unit GOA (2n) is electrically connected to the second clock signal line CBL, and a second clock terminal CB is electrically connected to the first clock signal line CKL, wherein n is a positive integer. A first power supply terminal VH of each stage shift register unit is electrically connected to the first power supply line VGH, and a second power supply terminal VL is electrically connected to the second power supply line VGL. However, this embodiment is not limited thereto.

Figure 5:
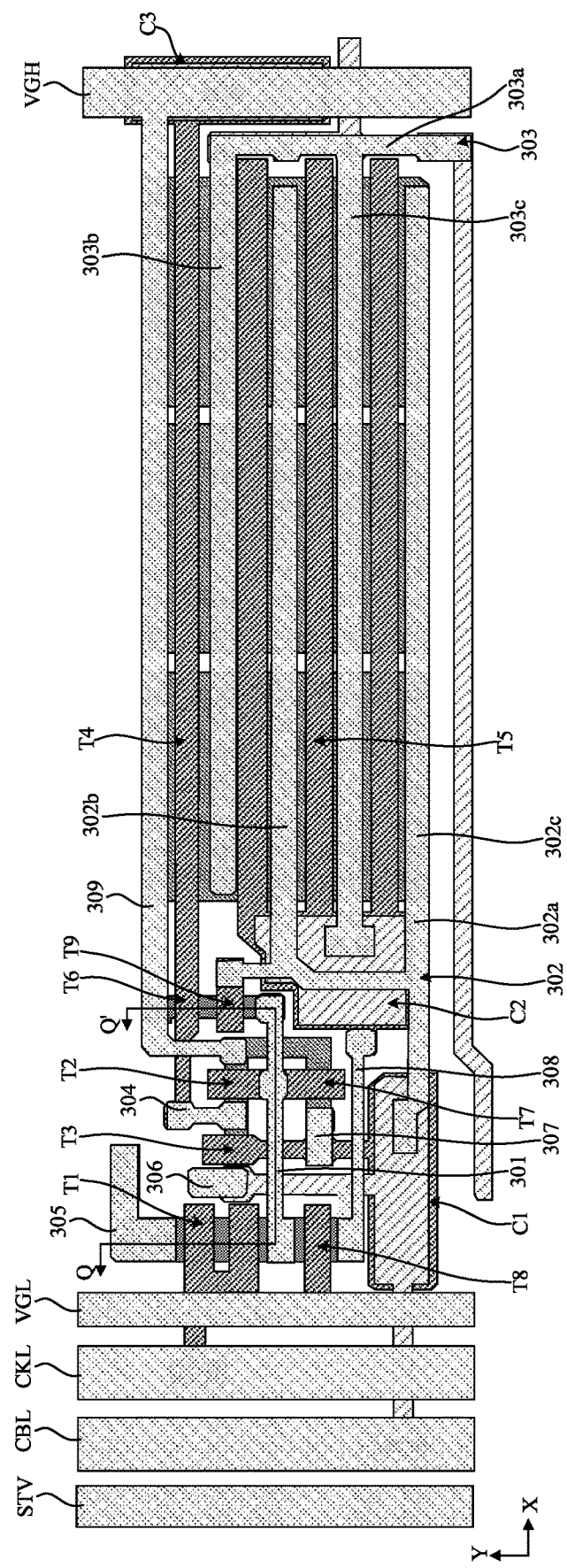
FIG. 5 is a top view of a shift register unit according to at least one embodiment of the present disclosure.
Figure 6:
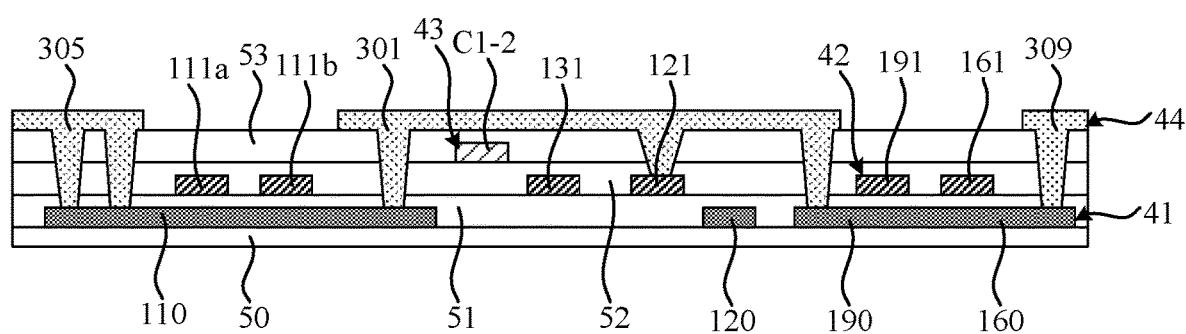
FIG. 6 is a partial cross-sectional schematic diagram along a Q-Q' direction in FIG. 5.

FIG. 5 is a top view of a shift register unit according to at least one embodiment of the present disclosure. FIG. 6 is a partial cross-sectional schematic diagram along a Q-Q' direction in FIG. 5. An equivalent circuit diagram of the shift register unit of the exemplary implementation is shown in FIG. 2. In the exemplary implementation, a case that a transistor in the shift register unit is a P-type transistor and is also a Low Temperature Poly Silicon thin film transistor is taken as an example for description. However, this embodiment is not limited thereto.

In some exemplary implementations, as shown in FIG. 5, in a plane parallel to the display substrate, the first control circuit is located between the input circuit and the output circuit in the first direction X, and the first control circuit is arranged along the first direction X. The second control circuit is adjacent to the first control circuit in the second direction Y. The third control circuit is located between the first control circuit and the output circuit in the first direction X, and the third control circuit is arranged along the second direction Y. The fourth control circuit is adjacent to the input circuit in the second direction Y. The first direction X intersects with the second direction Y, for example, the first direction X is perpendicular to the second direction Y. The circuit arrangement of the shift register unit of the exemplary embodiment may reduce the vias, thereby saving the occupied space.

In some exemplary implementations, as shown in FIG. 5, in a plane parallel to the display substrate, a start signal line STV, a first clock signal line CKL, a second clock signal line CBL, and a second power supply line VGL are located on a side of the input circuit away from the first control circuit. The first power supply line VGH is located on a side of the output circuit away from the third control circuit. The second power supply line VGL is adjacent to the input circuit and the fourth control circuit in the first direction X. The second power supply line VGL, the first clock signal line CKL, the second clock signal line CBL, and the start signal line STV are sequentially arranged along a direction away from the input circuit in the first direction X. The first power supply line VGH is configured to continuously provide a first voltage signal with a high level, and the second power supply line VGL is configured to continuously provide a second voltage signal with a low level. The first clock signal line CKL is configured to provide a first clock signal, and the second clock signal line CBL is configured to provide a second clock signal. However, this embodiment is not limited thereto. For example, the second power supply line VGL, the second clock signal line CBL, the first clock signal line CKL, and the start signal line STV may be sequentially arranged along a direction away from the input circuit in the first direction X.

In some exemplary implementations, as shown in FIG. 5, in a plane parallel to the display substrate, the second transistor T2 and the third transistor T3 of the first control circuit are sequentially arranged along the first direction X, and the second transistor T2 and the third transistor T3 are adjacent in the first direction X. The third transistor T3 is located on a side of the second transistor T2 close to the input circuit in the first direction X. The second transistor T2 of the first control circuit and the seventh transistor T7 of the second control circuit are adjacent in the second direction Y. The first capacitor C1 of the second control circuit is located on a side of the seventh transistor T7 away from the second transistor T2 in the second direction Y. The first capacitor C1 is adjacent to the second power supply line VGL in the first direction X, and the first capacitor C1 is adjacent to the seventh transistor T7 and the eighth transistor T8 of the fourth control circuit in the second direction Y. The sixth transistor T6 and the ninth transistor T9 of the third control circuit are adjacent in the second direction Y, and are located in the first direction X between the second transistor T2 of the first control circuit and the fourth transistor T4 of the output circuit. The fourth transistor T4 and the fifth transistor T5 of the output circuit are adjacent in the second direction Y. The fourth transistor T4 and the third capacitor C3 of the output circuit are adjacent in the first direction X, and the third capacitor C3 is located on a side of the fourth transistor T4 away from the third control circuit. The fifth transistor T5 and the second capacitor C2 of the output circuit are adjacent in the first direction X, and the second capacitor C2 is located on a side of the fifth transistor T5 close to the second control circuit. In the second direction Y, the ninth transistor T9 is adjacent to the second capacitor C2; and in the first direction X, the second capacitor C2 is adjacent to the seventh transistor T7 and the first capacitor C1. However, this embodiment is not limited thereto.

In the present exemplary implementation, the first transistor T1 and the eighth transistor T8 are arranged along the second direction Y, the second transistor T2 and the seventh transistor T7 are arranged along the second direction Y, and the sixth transistor T6 and the ninth transistor T9 are arranged along the second direction Y, which is beneficial to sharing the arrangement of the trace of the first node and reducing the space occupation. The second transistor T2 and the third transistor T3 are arranged along the first direction X, which is beneficial to sharing the arrangement of the trace of the second node and reducing the wiring space. The fourth transistor T4 and the fifth transistor T5 are arranged along the second direction Y, which is beneficial to increasing the size of the output transistor and improving a rate of the space utilization.

In some exemplary implementations, as shown in FIG. 5, in a plane parallel to the display substrate, an orthographic projection of the third capacitor C3 on the base substrate is overlapped with an orthographic projection of the first power supply line VGH on the base substrate. In this way, the third capacitor C3 does not occupy the arrangement space alone, which can make the arrangement space more compact and improve the rate of the space utilization. The second capacitor C2 and the fifth transistor T5 are arranged adjacent to each other in the first direction X, so that space may be better utilized.

In some exemplary implementations, as shown in FIG. 6, in the direction perpendicular to the display substrate, the non-display region of the display substrate may include: a base substrate 50, and a semiconductor layer 41, a first conductive layer 42, a second conductive layer 43 and a third conductive layer 44 arranged on the base substrate 50 in sequence, wherein a first insulation layer 51 is arranged between the semiconductor layer 41 and the first conductive layer 42, a second insulation layer 52 is arranged between the first conductive layer 42 and the second conductive layer 43, and a third insulation layer 53 is arranged between the second conductive layer 43 and the third conductive layer 44. In some examples, the first insulation layer 51 to the third insulation layer 53 may all be inorganic insulation layers. However, this embodiment is not limited thereto.

Figure 7A:
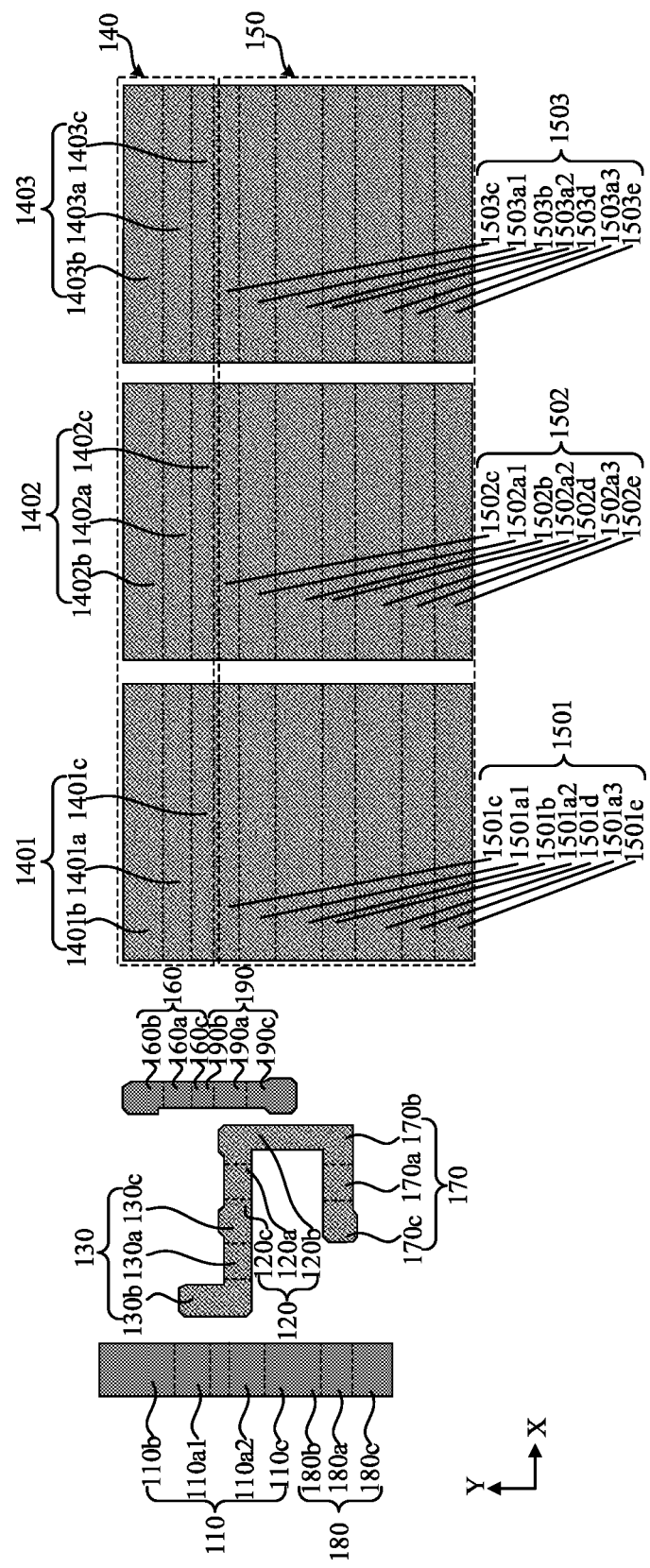
FIG. 7A is a top view of a shift register unit after a semiconductor layer is formed according to at least one embodiment of the present disclosure.

FIG. 7A is a top view of a shift register unit after a semiconductor layer is formed according to at least one embodiment of the present disclosure. As shown in FIG. 5 to FIG. 7A, the semiconductor layer 41 of the non-display region at least includes active layers of a plurality of transistors of the shift register unit. For example, the semiconductor layer 41 at least includes: an active layer 110 of a first transistor T1, an active layer 120 of a second transistor T2, an active layer 130 of a third transistor T3, an active layer 140 of a fourth transistor T4, an active layer 150 of a fifth transistor T5, an active layer 160 of a sixth transistor T6, an active layer 170 of a seventh transistor T7, an active layer 180 of an eighth transistor T8 and an active layer 190 of a ninth transistor T9.

In exemplary implementations, a material of the semiconductor layer 41 may include, for example, polysilicon. An active layer may include at least one channel region and multiple doped regions. The channel region may not be doped with an impurity, and has characteristics of a semiconductor. The multiple doped regions may be on two sides of the channel region and doped with impurities, and thus have conductivity. The impurities may be changed according to a type of a transistor. In some examples, a doped region of the active layer may be interpreted as a source or a drain of a transistor. In addition, portions of the active layers between the transistors may be interpreted as wirings doped with impurities, and may be used for electrically connecting the transistors.

In some exemplary implementations, as shown in FIG. 7A, in the first direction X, the active layer 130 of the third transistor T3 and the active layer 120 of the second transistor T2 are sequentially arranged along a direction away from the active layer 110 of the first transistor T1, and are located between the active layer 110 of the first transistor T1 and the active layer 190 of the ninth transistor T9; the active layer 160 of the sixth transistor T6 and the active layer 190 of the ninth transistor T9 are located between the active layer 120 of the second transistor T2 and the active layer 140 of the fourth transistor T4; and the active layer 170 of the seventh transistor T7 is located between the active layer 180 of the eighth transistor T8 and the active layer 150 of the fifth transistor T5. In the second direction Y, the active layer 110 of the first transistor T1 and the active layer 180 of the eighth transistor T8 are arranged sequentially; the active layer 120 of the second transistor T2 and the active layer 170 of the seventh transistor T7 are arranged sequentially; the active layer 160 of the sixth transistor T6 and the active layer 190 of the ninth transistor T9 are arranged sequentially; and the active layer 140 of the fourth transistor T4 and the active layer 150 of the fifth transistor T5 are arranged sequentially.

In some exemplary implementations, as shown in FIG. 7A, the active layer 110 of the first transistor T1 may include channel regions 110a1 and 110a2, and a first doped region 110b and a second doped region 110c located on two sides of the channel regions 110a1 and 110a2 along the second direction Y. For example, a first electrode of the first transistor T1 may correspond to the first doped region 110b, and a second electrode of the first transistor T1 may correspond to the second doped region 110c. The active layer 180 of the eighth transistor T8 may include a channel region 180a, and a first doped region 180b and a second doped region 180c located on two sides of the channel region 180a along the second direction Y. For example, the first electrode of the eighth transistor T8 may correspond to the first doped region 180b, and a second electrode of the eighth transistor T8 may correspond to the second doped region 180c. In this example, the second doped region 110c of the active layer 110 of the first transistor T1 is connected to the first doped region 180b of the active layer 180 of the eighth transistor T8. In this example, the active layer 110 of the first transistor T1 and the active layer 180 of the eighth transistor T8 may be of an integral structure, for example, may be a rectangle.

In some exemplary implementations, as shown in FIG. 7A, the active layer 130 of the third transistor T3 may include: a channel region 130a, and a first doped region 130b and second doped region 130c located on two sides of the channel region 130a along the first direction X. For example, a first electrode of the third transistor T3 may correspond to the first doped region 130b, and a second electrode may correspond to the second doped region 130c. The active layer 120 of the second transistor T2 may include a channel region 120a, and a first doped region 120b and a second doped region 120c located on two sides of the channel region 120a along the first direction X. For example, a first electrode of the second transistor T2 may correspond to the first doped region 120b, and a second electrode may correspond to the second doped region 120c. The active layer 170 of the seventh transistor T7 may include a channel region 170a, and a first doped region 170b and a second doped region 170c located on two sides of the channel region 170a along the first direction X. For example, a first electrode of the seventh transistor T7 may correspond to the first doped region 170b, and a second electrode may correspond to the second doped region 170c. In this example, the second doped region 130c of the active layer 130 of the third transistor T3 is connected to the second doped region 120c of the active layer 120 of the second transistor T2, and the first doped region 120b of the active layer 120 of the second transistor T2 is connected to the first doped region 170b of the active layer 170 of the seventh transistor T7. In this example, the active layer 120 of the second transistor T2 and the active layer 130 of the third transistor T3 may be of an integral structure, for example, may be L-shaped. The active layer 120 of the second transistor T2 and the active layer 170 of the seventh transistor T7 may be of an integral structure, for example, may be U-shaped, and the U-shaped opening faces the active layer 110 of the first transistor T1 and the active layer 180 of the eighth transistor T8.

In some exemplary implementations, as shown in FIG. 7A, the active layer 160 of the sixth transistor T6 may include: a channel region 160a, and a first doped region 160b and second doped region 160c located on two sides of the channel region 160a along the second direction Y. For example, a first electrode of the sixth transistor T6 may correspond to the first doped region 160b, and a second electrode may correspond to the second doped region 160c. The active layer 190 of the ninth transistor T9 may include a channel region 190a, and a first doped region 190b and a second doped region 190c located on two sides of the channel region 190a along the second direction Y. For example, a first electrode of the ninth transistor T9 may correspond to the first doped region 190b, and a second electrode may correspond to the second doped region 190c. In this example, the second doped region 160c of the active layer 160 of the sixth transistor T6 is connected to the first doped region 190b of the active layer 190 of the ninth transistor T9. In this example, the active layer 160 of the sixth transistor T6 and the active layer 190 of the ninth transistor T9 may be of an integral structure, for example, may be a rectangle.

In some exemplary implementations, as shown in FIG. 7A, the active layer 140 of the fourth transistor T4 includes a first partition 1401, a second partition 1402 and a third partition 1403 that are arranged sequentially along the first direction X. The first partition 1401 includes a channel region 1401a, and a first doped region 1401b and a second doped region 1401c located on two sides of the channel region 1401a along the second direction Y. The second partition 1402 of the active layer 140 includes a channel region 1402a, and a first doped region 1402b and a second doped region 1402c located on both sides of the channel region 1402a along the second direction Y. The third partition 1403 of the active layer 140 includes a channel region 1403a, and a first doped region 1403b and a second doped region 1403c located on both sides of the channel region 1403a along the second direction Y. The active layer 150 of the fifth transistor T5 includes a first partition 1501, a second partition 1502, and a third partition 1503 which are arranged sequentially along the first direction X. The first partition 1501 of the active layer 150 includes channel regions 1501a1, 1501a2, and 1501a3, a first doped region 1501b located between the channel regions 1501a1 and 1501a2 along the second direction Y, a second doped region 1501c located on a side of the channel region 1501a1 away from the first doped region 1501b along the second direction Y, a third doped region 1501d located between the channel regions 1501a2 and 1501a3 along the second direction Y, and a fourth doped region 1501e located on a side of the channel region 1501a3 away from the third doped region 1501d along the second direction Y. Similarly, the second partition 1502 of the active layer 150 includes channel regions 1502a1, 1502a2, and 1502a3, and a first doped region 1502b, a second doped region 1502c, a third doped region 1502d, and a fourth doped region 1502e. The third partition 1503 of the active layer 150 includes channel regions 1503a1, 1503a2, and 1503a3, and a first doped region 1503b, a second doped region 1503c, a third doped region 1503d, and a fourth doped region 1503e. In this example, the first partition 1401 of the active layer 140 of the fourth transistor T4 and the first partition 1501 of the active layer 150 of the fifth transistor T5 may be of an integral structure, for example may be a rectangle. The first partition 1402 of the active layer 140 of the fourth transistor T4 and the first partition 1502 of the active layer 150 of the fifth transistor T5 may be of an integral structure, for example may be a rectangle. The third partition 1403 of the active layer 140 of the fourth transistor T4 and the third partition 1503 of the active layer 150 of the fifth transistor T5 may be of an integral structure, for example may be a rectangle. However, this embodiment is not limited thereto.

Figure 7B:
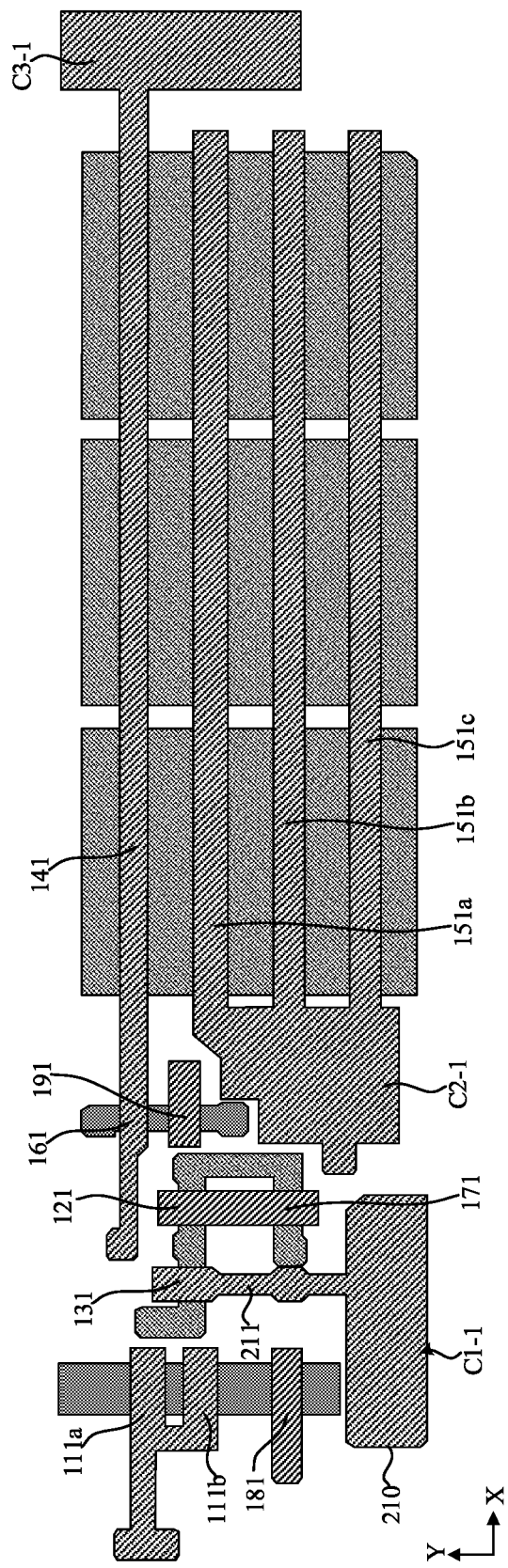
FIG. 7B is a top view of a shift register unit after a first conductive layer is formed according to at least one embodiment of the present disclosure.

FIG. 7B is a top view of a shift register unit after a first conductive layer is formed according to at least one embodiment of the present disclosure. As shown in FIG. 5 to FIG. 7B, the first conductive layer 42 of the non-display region at least includes control electrodes of a plurality of transistors of the shift register unit and first electrode plates of a plurality of capacitors. For example, the first conductive layer 42 at least includes control electrodes 111a and 111b of the first transistor T1, a control electrode 121 of the second transistor T2, a control electrode 131 of the third transistor T3, a control electrode 141 of the fourth transistor T4, control electrodes 151a, 151b and 151c of the fifth transistor T5, a control electrode 161 of the sixth transistor T6, a control electrode 171 of the seventh transistor T7, a control electrode 181 of the eighth transistor T8, a control electrode 191 of the ninth transistor T9, a first electrode plate C1-1 of the first capacitor C1, a first electrode plate C2-1 of the second capacitor C2, and a first electrode plate C3-1 of the third capacitor C3.

In some exemplary implementations, as shown in FIG. 7B, the control electrodes 111a and 111b of the first transistor T1 may be of an integral structure. The control electrode 121 of the second transistor T2 and the control electrode 171 of the seventh transistor T7 may be of an integral structure, for example may be a rectangle extending along the second direction Y. The control electrode 131 of the third transistor T3 and the first electrode plate C1-1 of the first capacitor C1 may be of an integral structure. The control electrode 141 of the fourth transistor T4, the control electrode 161 of the sixth transistor T6, and the first electrode plate C3-1 of the third capacitor C3 may be of an integral structure. The control electrodes 151a, 151b, and 151c of the fifth transistor T5 and the first electrode plate C2-1 of the second capacitor C2 may be of an integral structure. However, this embodiment is not limited thereto.

In the present exemplary implementation, the first transistor T1 may be a double-gate transistor, and the fifth transistor T5 may be a triple-gate transistor, so that the occurrence of a leakage current is prevented and reduced. However, this embodiment is not limited thereto.

Figure 7C:
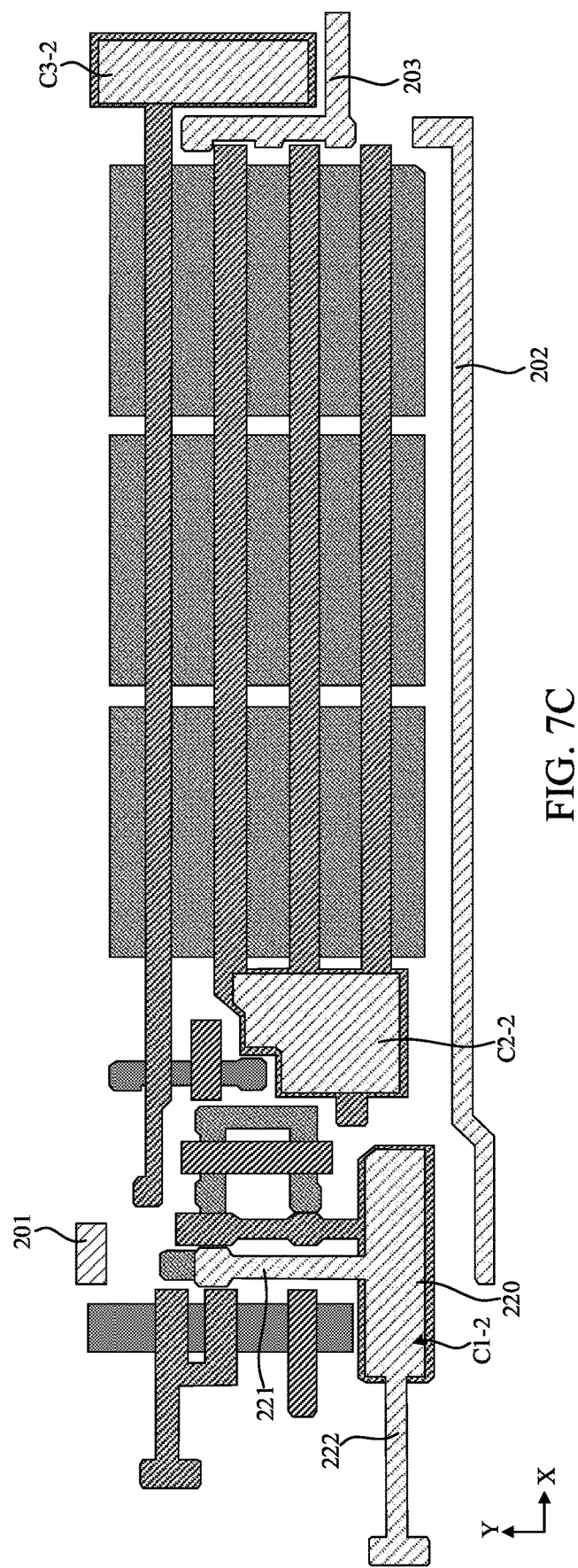
FIG. 7C is a top view of a shift register unit after a second conductive layer is formed according to at least one embodiment of the present disclosure.

FIG. 7C is a top view of a shift register unit after a second conductive layer is formed according to at least one embodiment of the present disclosure. As shown in FIG. 5 to FIG. 7C, the second conductive layer 43 of the non-display region at least includes second electrode plates of a plurality of capacitors of the shift register unit. For example, the second conductive layer 43 may include a second electrode plate C1-2 of the first capacitor C1, a second electrode plate C2-2 of the second capacitor C2, a second electrode plate C3-2 of the third capacitor C3, an input terminal 201, an output terminal 203, and a cascaded signal line 202.

In some exemplary implementations, as shown in FIG. 7B and FIG. 7C, the first electrode plate C1-1 of the first capacitor C1 has a first electrode plate body 210, and a first connection portion 211 extending along the second direction Y from the first electrode plate body 210. The second electrode plate C1-2 of the first capacitor C1 has a second electrode plate body 220, a second connection portion 221 extending along the second direction Y from the second electrode plate body 220, and a third connection portion 222 extending along the first direction X from the second electrode plate body 220. An orthographic projection of a first electrode plate body 210 of a first electrode plate C1-1 of a first capacitor C1 on the base substrate contains an orthographic projection of the second electrode plate body 220 of the second electrode plate C1-2 on the base substrate. An orthographic projection of the first connection portion 211 of the first electrode plate C1-1 on the base substrate is not overlapped with an orthographic projection of the second connection portion 221 of the second electrode plate C1-2 on the base substrate. An orthographic projection of the first electrode plate C2-1 of the second capacitor C2 on the base substrate contains an orthographic projection of the second electrode plate C2-2 on the base substrate. An orthographic projection of the first electrode plate C3-1 of the third capacitor C3 on the base substrate contains an orthographic projection of the second electrode plate C3-2 on the base substrate. However, this embodiment is not limited thereto.

In some exemplary implementations, as shown in FIG. 7C, the output terminal 203 is located on a side of the third capacitor C3 close to the output circuit. For example, an orthographic projection of the output terminal 203 on the base substrate may be L-shaped. The cascaded signal line 202 is adjacent to the output circuit in the second direction Y. The cascaded signal line 202 extends along the first direction X. The cascaded signal line 202 and an input terminal of the next stage shift register unit may be of an integral structure. The input terminal 201 of the current stage shift register unit may be electrically connected to an output terminal of the previous stage shift register unit through the cascaded signal line to which the previous stage shift register unit is connected. However, this embodiment is not limited thereto.

Figure 7D:
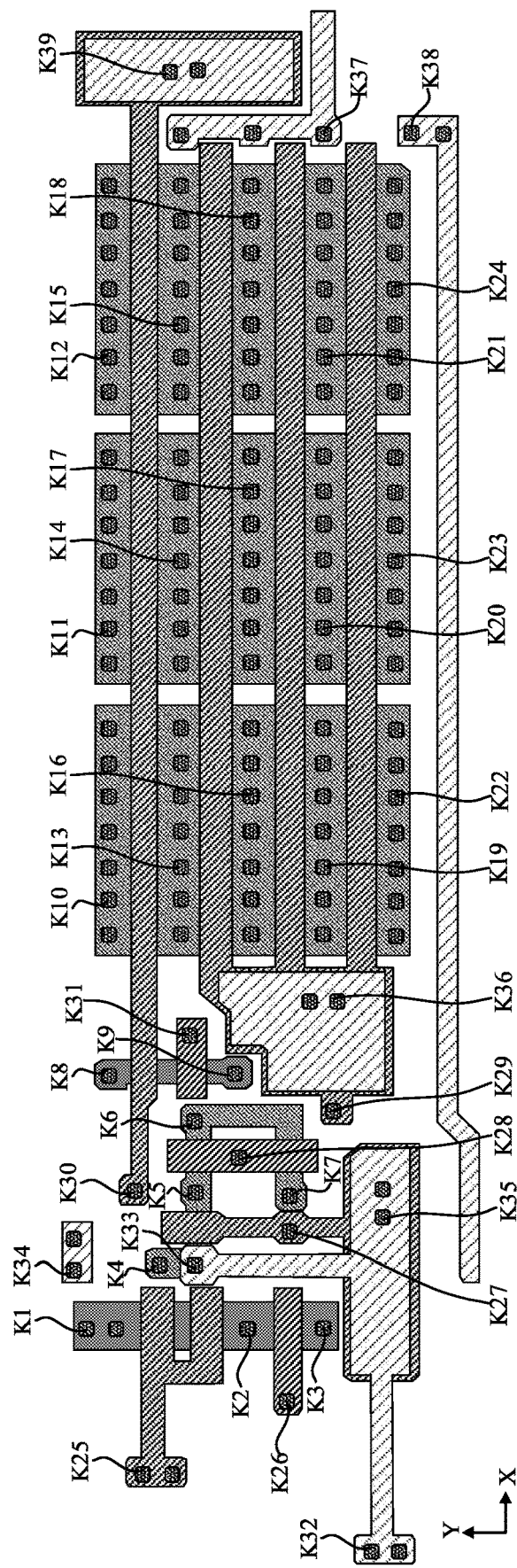
FIG. 7D is a top view of a shift register unit after a third insulation layer is formed according to at least one embodiment of the present disclosure.

FIG. 7D is a top view of a shift register unit after a third insulation layer is formed according to at least one embodiment of the present disclosure. As shown in FIG. 5 to FIG. 7D, a plurality of vias is formed on a third insulating layer 53 of the non-display region. For example, the plurality of vias may include a first via K1 to a thirty-ninth via K39. The third insulation layer 53, the second insulation layer 52, and the first insulation layer 51 within the first via K1 to the twenty-fourth via K24 are removed to expose a surface of the semiconductor layer 41. The third insulation layer 53 and the second insulation layer 52 within the twenty-fifth via K25 to the thirtieth via K30 are removed to expose a surface of the first conductive layer 42. The third insulation layer 53 within the thirty-first via K31 to the thirty-ninth via K39 is removed to expose a surface of the second conductive layer 43.

In some exemplary implementations, as shown in FIG. 5, the third conductive layer 44 of the non-display region at least includes a plurality of connection electrodes (e.g. A first connection electrode 301, a second connection electrode 302, a third connection electrode 303, a fourth connection electrode 304, a fifth connection electrode 305, a sixth connection electrode 306, a seventh connection electrode 307, an eighth connection electrode 308, and a power supply connection electrode 309), a start signal line STV, a first clock signal line CKL, a second clock signal line CBL, a first power supply line VGH, and a second power supply line VGL. In some examples, the start signal line STV, the first clock signal line CKL, the second clock signal line CBL, the first power supply line VGH, and the second power supply line VGL all extend along the second direction Y, and the second power supply line VGL, the first clock signal line CKL, the second clock signal line CBL, and the start signal line STV are sequentially arranged in the first direction X along a direction away from the first transistor T1. The first power supply line VGH is located on a side of the fourth transistor T4 and the fifth transistor T5 away from the second power supply line VGL. An orthographic projection of the first power supply line VGH on the base substrate is overlapped with an orthographic projection of the third capacitor C3 on the base substrate.

In some exemplary implementations, as shown in FIG. 5 to FIG. 7D, the first clock signal line CKL is electrically connected to the control electrodes 111a and 111b of the first transistor T1 through two twenty-fifth vias K25 arranged vertically. The second clock signal line CBL is electrically connected to the third connection portion 222 of the second electrode plate C1-2 of the first capacitor C1 through two thirty-second vias K32 arranged vertically. The first power supply line VGH is electrically connected to the second electrode plate C3-2 of the third capacitor C3 through two thirty-ninth vias K39 arranged vertically. The second power supply line VGL is electrically connected to the control electrode 181 of the eighth transistor T8 through the twenty-sixth via K26.

In some exemplary implementations, as shown in FIG. 5 to FIG. 7D the first connection electrode 301 extends along the first direction X. The first connection electrode 301 is electrically connected to the second doped region 110c of the active layer 110 of the first transistor T1 through the second via K2, and is also electrically connected to the control electrode 121 of the second transistor T2 through the twenty-eighth via K28, and may also be electrically connected to the second doped region 190c of the active layer 190 of the ninth transistor T9 through the ninth via K9. An orthographic projection of the first connection electrode 301 on the base substrate is overlapped with an orthographic projection of the first connection portion 211 of the first electrode plate C1-1 and the second connection portion 221 of the second electrode plate C1-2 of the first capacitor C1 on the base substrate. In this example, the plurality of transistors may be electrically connected to the first node through the first connection electrode 301, thus simplifying the common arrangement of the trace of the first node, which may reduce wiring space and avoid space occupation caused by using more vias.

In some exemplary implementations, as shown in FIG. 5 to FIG. 7D, the second connection electrode 302 has a first body 302a, and two first extension portions 302b and 302c extending along the first direction X from the first body 302a. The first extension portions 302b and 302c extend along a direction away from the input circuit in the first direction X. An orthographic projection of the first body 302a on the base substrate is substantially "⊥"-typed. The orthographic projection of the first body 302a on the base substrate is overlapped with an orthographic projection of the second capacitor C2 on the base substrate. The orthographic projection of the first extension portion 302b on the base substrate is located in the second direction Y on a side of the orthographic projection of the first extension portion 302c away from the cascaded signal line 202 on the base substrate. The first body 302a is electrically connected to the second electrode plate C102 of the first capacitor C1 through the thirty-fifth via K35, and is also electrically connected to the control electrode 191 of the ninth transistor T9 through the thirty-first via K31. The first extension portion 302b is electrically connected to the first doped region 1501b of the first partition 1501 of the active layer 150 of the fifth transistor T5 through the plurality (e.g. seven) of sixteenth vias K16 arranged side by side, is also electrically connected to the first doped region 1502b of the second partition 1502 of the active layer 150 of the fifth transistor T5 through the plurality (e.g. seven) of seventeenth vias K17 arranged side by side, and is also electrically connected to the first doped region 1503b of the third partition 1503 of the active layer 150 of the fifth transistor T5 through a plurality (e.g. seven) of eighteenth vias K18 arranged side by side. The first extension portion 302c is electrically connected to the fourth doped region 1501e of the first partition 1501 of the active layer 150 of the fifth transistor T5 through the plurality of (e.g. seven) twenty-second via K22 arranged side by side, is also electrically connected to the fourth doped region 1502e of the second partition 1502 of the active layer 150 of the fifth transistor T5 through the plurality of (e.g. seven) twenty-third via K23 arranged side by side, and is also electrically connected to the fourth doped region 1503e of the third partition 1503 of the active layer 150 of the fifth transistor T5 through the plurality of (e.g. seven) twenty-fourth via K24 arranged side by side. In this example, the second connection electrode 302 is electrically connected to the second electrode plate C1-2 of the first capacitor C1, and is further electrically connected to the second clock signal line CBL and is configured to transmit the second clock signal.

In some exemplary implementations, as shown in FIG. 5 to FIG. 7D, the third connection electrode 303 has a second body 303a and two second extension portions 303b and 303c extending along the first direction X from the second body 303a. The second extension portions 303b and 303c extend along a direction close to the input circuit in the first direction X. The second body 303a extends along the second direction Y. The second extension portion 303b is located on a side of the second extension portion 303c away from the first extension portion 302c in the second direction Y. The second body 303a is electrically connected to the output terminal 203 through the plurality of (e.g. three) thirty-seventh vias K37 arranged vertically, and is also electrically connected to the cascaded signal line 202 through two thirty-eighth vias K38 arranged vertically. The second extension portion 303b is electrically connected to the second doped region 1501c of the first partition 1501 of the active layer 150 of the fifth transistor T5 through the plurality (e.g. seven) of thirteenth vias K13 arranged side by side, is also electrically connected to the second doped region 1502c of the second partition 1502 of the active layer 150 of the fifth transistor T5 through the plurality (e.g. seven) of fourteenth vias K14 arranged side by side, and is electrically connected to the second doped region 1503c of the third partition 1503 of the active layer 150 of the fifth transistor T5 through the plurality (e.g. seven) of fifteenth vias K15 arranged side by side. The second extension portion 303c is electrically connected to the second electrode plate C2-2 of the second capacitor C2 through two thirty-sixth vias K36 arranged vertically, is also electrically connected to the third doped region 1501d of the first partition 1501 of the active layer 150 of the fifth transistor T5 through the plurality of (e.g. seven) nineteenth vias K19 arranged side by side, is also electrically connected to the third doped region 1502d of the second partition 1502 of the active layer 150 of the fifth transistor T5 through the plurality of (e.g. seven) twentieth vias K20 arranged side by side, and is also electrically connected to the third doped region 1503d of the third partition 1503 of the active layer 150 of the fifth transistor T5 through the plurality of (e.g. seven) twenty-first vias K21 arranged side by side. In this example, the third connection electrode 303 is electrically connected to the output terminal 203 and is configured to transmit the output signal.

In the embodiments of the present disclosure, "arranged side by side" may mean being arranged in sequence along the first direction X, and "arranged vertically" may mean being arranged in sequence along the second direction Y.

In the present exemplary implementation, the second connection electrode 302 is electrically connected to the second clock signal line CBL through the second electrode plate C1-2 of the first capacitor C1, and is configured to transmit the second clock signal; and the third connection electrode 303 is electrically connected to the output terminal 203 and is configured to transmit the output signal. The second connection electrode 302 has a comb-shaped structure, and the third connection electrode 303 also has a comb-shaped structure, wherein the first extension portion of the second connection electrode 302 and the second extension portion of the third connection electrode 303 may be interspersed with each other, thereby making the placement of signal traces more reasonable and beneficial to improving the rate of the space utilization.

In some exemplary implementations, as shown in FIG. 5 to FIG. 7D, the fourth connection electrode 304 extends along the second direction Y. The fourth connection electrode 304 may be electrically connected to the second doped region 130c of the active layer 130 of the third transistor T3 through the fifth via K5, and may also be electrically connected to the control electrode 161 of the sixth transistor T6 through the thirtieth via K30. In this example, the fourth connection electrode 304 is provided, which may achieve an electrically connection between the plurality of transistors and the second node, thereby simplifying the common arrangement of the trace of the second nodes, which may reduce the wiring space.

In some exemplary implementations, as shown in FIG. 5 to FIG. 7D, the fifth connection electrode 305 may be electrically connected to the first doped region 110b of the active layer 110 of the first transistor T1 through two first vias K1 arranged vertically, and may also be electrically connected to the input terminal 201 through two thirty-fourth vias K34 arranged horizontally. An orthographic projection of the fifth connection electrode 305 on the base substrate may be L-shaped.

In some exemplary implementations, as shown in FIG. 5 to FIG. 7D, the sixth connection electrode 306 may be electrically connected to the first doped region 130b of the active layer 130 of the third transistor T3 through the fourth via K4, and may also be electrically connected to the second electrode plate C1-2 of the first capacitor C1 through the thirty-third via K33. The sixth connection electrode 306 may extend along the second direction Y. The seventh connection electrode 307 may be electrically connected to the first electrode plate C1-1 of the first capacitor C1 through the twenty-seventh via K27, and may also be electrically connected to the second doped region 170c of the active layer 170 of the seventh transistor T7 through the seventh via K7. The seventh connection electrode 307 may extend along the first direction X. The eighth connection electrode 308 may be electrically connected to the second doped region 180c of the active layer 180 of the eighth transistor T8 through the third via K3, and may be electrically connected to the first electrode plate C2-1 of the second capacitor C2 through the twenty-ninth via K29. The eighth connection electrode 308 may extend along the first direction X.

In some exemplary implementations, as shown in FIG. 5-FIG. 7D, the power supply connection electrode 309 may be electrically connected to the first doped region 120b of the active layer 120 of the second transistor T2 through the sixth via K6, is also electrically to the first doped region 160b of the active layer 160 of the sixth transistor T6 through the eighth via K8, is also electrically to the first doped region 1401b of the first partition 1401 of the fourth transistor T4 through a plurality of (e.g. seven) tenth via K10 arranged side by side, is also electrically to the first doped region 1402b of the second partition 1402 of the fourth transistor T4 through a plurality of (e.g. seven) eleventh via K11 arranged side by side, and is also electrically to the first doped region 1403b of the third partition 1403 of the fourth transistor T4 through the plurality of (e.g. seven) twelfth via K12. The power supply connection electrode 309 and the first power supply line VGH1 may be of an integral structure. An orthographic projection of the power supply connection electrode 309 on the base substrate may be L-shaped. However, this embodiment is not limited thereto.

In the present exemplary implementation, the second electrode plate C1-2 of the first capacitor C1 may also transmit a second clock signal to the fifth transistor T5 in addition to being a capacitor plate, and may also be connected to the first electrode of the third transistor T3 as a conductive line. The first electrode plate C1-1 of the first capacitor C1 may be connected to the control electrode 131 of the third transistor T3 as a conductive line. An orthographic projection of the first connection electrode 301 on the base substrate is overlapped with an orthographic projection of the first connection portion 211 of the first electrode plate C1-1 and the second connection portion 221 of the second electrode plate C1-2 of the first capacitor C1 on the base substrate.

Exemplary description is made below for a preparation process of a display substrate. A "patterning process" mentioned in the present disclosure includes coating with a photoresist, mask exposure, development, etching, photoresist stripping, and other treatments for a metal material, an inorganic material, or a transparent conductive material, and includes coating with an organic material, mask exposure, development, and other treatments for an organic material. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film made of a material on a base substrate using deposition, coating, or other processes. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern".

"A and B are arranged in the same layer" mentioned in the present disclosure refers to that A and B are simultaneously formed by the same patterning process. The "thickness" of the thin film layer is a size of the film layer in a direction perpendicular to the display substrate. In the exemplary embodiment of the present disclosure, "a projection of A includes a projection of B" refers to that a boundary of a projection of B falls within a range of a boundary of a projection of A or the boundary of a projection of A is overlapped with the boundary of a projection of B.

The manufacturing process of the display substrate in accordance with the present exemplary embodiment may include the following steps.

(1) A base substrate is provided.

In some exemplary implementations, a base substrate 50 may be a rigid substrate or a flexible substrate. The rigid substrate may include one or more of glass and metal foil sheet. The flexible substrate may include one or more of polyethylene terephthalate, ethylene terephthalate, polyether ether ketone, polystyrene, polycarbonate, polyarylate, polyarylester, polyimide, polyvinyl chloride, polyethylene, and textile fiber.

(2) A pattern of a semiconductor layer is formed.

In some exemplary implementations, a semiconductor thin film is deposited on a base substrate 50, and the semiconductor thin film is patterned through a patterning process to form a pattern of a semiconductor layer arranged on the base substrate 50, as shown in FIG. 7A. The pattern of the semiconductor layer of the non-display region at least includes active layers of a plurality of transistors (for example, transistors T1 to T9) in a shift register unit. An active layer may include at least one channel region and multiple doped regions. The channel region may not be doped with an impurity, and has characteristics of a semiconductor. A doped region is doped with an impurity and therefore has conductivity. An impurity may be changed according to a type (e.g., an N type or a P type) of a transistor. In some examples, a material of the semiconductor thin film may be polysilicon.

(3) A pattern of a first conductive layer is formed.

In some exemplary implementations, a first insulation thin film and a first conductive thin film are sequentially deposited on the base substrate 50 where the aforementioned pattern is formed, and the first conductive thin film is patterned through a patterning process to form a first insulation layer 51 covering the pattern of the semiconductor layer and the pattern of the first conductive layer arranged on the first insulation layer 51, as shown in FIG. 7B. In some examples, the pattern of the first conductive layer may include control electrodes of a plurality of transistors (for example, the transistors T1 to T9) of the shift register unit, first electrode plates of a plurality of capacitors (for example, a first capacitor C1 to a third capacitor C3) of the shift register unit.

(4) A pattern of a second conductive layer is formed.

In some exemplary implementations, a second insulation thin film and a second conductive thin film are sequentially deposited on the base substrate 50 where the aforementioned pattern is formed, and the second conductive thin film is patterned by using a patterning process to form a second insulation layer 52 covering the first conductive layer and the pattern of the second conductive layer arranged on the second insulation layer 52, as shown in FIG. 7C. In some examples, the pattern of the second conductive layer may include second electrode plates of a plurality of capacitors (for example, the first capacitor C1 to the third capacitor C3) of the shift register unit, an output terminal, and an input terminal.

(5) A pattern of a third insulation layer is formed.

In some exemplary implementations, a third insulation thin film is deposited on the base substrate 50 on which the aforementioned patterns are formed, and the third insulation thin film is patterned by a patterning process to form the pattern of the third insulation layer 53 covering the second conductive layer, as shown in FIG. 7D. In some examples, a plurality of vias are opened on the third insulation layer 53. For example, the plurality of vias may include a first via K1 to a thirty-ninth via K39. The third insulation layer 53, the second insulation layer 52, and the first insulation layer 51 within the first via K1 to the twenty-fourth via K24 are removed to expose a surface of the semiconductor layer 41. The third insulation layer 53 and the second insulation layer 52 within the twenty-fifth via K25 to the thirtieth via K30 are removed to expose a surface of the first conductive layer 42. The third insulation layer 53 within the thirty-first via K31 to the thirty-ninth via K39 is removed to expose a surface of the second conductive layer 43.

(6) A pattern of a third conductive layer is formed.

In some exemplary implementations, a third conductive thin film is deposited on the base substrate 50 where the aforementioned patterns are formed, and the third conductive thin film is patterned through a patterning process to form the pattern of the third conductive layer on the third insulation layer 53, as shown in FIG. 5. In some examples, the pattern of the third conductive layer may include a plurality of connection electrodes (e.g. a first connection electrode 301 to an eighth connection electrode 308, a power supply connection electrodes 309), a first clock signal line CKL, a second clock signal line CBL, a first power supply line VGH, a second power supply line VGL, and a start signal line STV.

Subsequently, a fourth insulation layer and a fifth insulation layer may be sequentially formed on a side of the third conductive layer 44 away from the base substrate 50. While a shift register unit is formed in the non-display region, a pixel drive circuit may be formed in the display region. For example, a semiconductor layer of the display region may include active layers of the transistors of the pixel drive circuit, the first conductive layer of the display region may include control electrodes of the transistors of the pixel drive circuit and a first electrode of a storage capacitor, the second conductive layer of the display region may at least include a second electrode of the storage capacitor of the pixel drive circuit, and a third conductive layer of the display region may at least include a first electrode and a second electrode of the transistor of the pixel drive circuit.

In some exemplary implementations, after the fifth insulation layer is formed, patterns of an anode layer, a pixel define layer, an organic light emitting layer, a cathode layer, and an encapsulation layer may be sequentially formed in the display region. In some examples, an anode thin film is deposited on the base substrate where the display region of the aforementioned patterns is formed, and the anode thin film is patterned through a patterning process to form a pattern of an anode on the fifth insulation layer. Next, on the base substrate where the aforementioned patterns are formed, a pixel definition thin film is coated, and a pattern of a Pixel Define layer (PDL) is formed through masking, exposure, and development processes. The pixel define layer is formed in each sub-pixel in the display region. A pixel opening exposing the anode is formed in the pixel define layer in each sub-pixel. Subsequently, an organic emitting layer is formed within the pixel openings formed above, and the organic emitting layer is connected with an anode. Subsequently, a cathode thin film is deposited and patterned through a patterning process to form a pattern of a cathode. The cathode is connected with the organic light emitting layer and the second power supply line respectively. Then, an encapsulation layer is formed on the cathode. The encapsulation layer may include a stacked structure of an inorganic material/an organic material/an inorganic material. In some possible implementations, the cathode may be connected with the second power supply line through a plurality of manners, such as laser drilling.

In some exemplary implementation modes, the first conductive layer 42, the second conductive layer 43, and the third conductive layer 44 may be made of a metal material, such as any one or more of Argentum (Ag), Copper (Cu), Aluminum (Al), and Molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first insulation layer 51, the second insulation layer 52, the third insulation layer 53, and the fourth insulation layer may be made of any one or more of silicon oxide (SiOx), silicon nitride (SiNx), and silicon oxynitride (SiON), and may be single layer, multilayer, or composite layers. The fifth insulation layer may be made of an organic material, such as polyimide, acrylic, or polyethylene terephthalate. The first insulation layer 51 and the second insulation layer 52 may be referred to as Gate Insulation (GI) layers, the third insulation layer 53 may be referred to as an Interlayer Dielectric (ILD) layer, the fourth insulation layer may be referred to as a Passivation (PVX) layer, and the fifth insulation layer may be referred as a planarization layer. The pixel define layer may be made of an organic material, such as polyimide, acrylic, or polyethylene terephthalate. The anode may be made of a transparent conductive material, e.g., Indium Tin Oxide (ITO) or Indium Zinc Oxide (IZO). The cathode may be made of any one or more of Magnesium (Mg), Argentum (Ag), Aluminum (Al), Copper (Cu), and Lithium (Li), or an alloy made of any one or more of the aforementioned metals. However, this embodiment is not limited thereto. For example, the anode may be made of a reflective material such as a metal, and the cathode may be made of a transparent conductive material.

The structure shown in the exemplary embodiment and the preparation process thereof are merely illustrative. In some exemplary implementation modes, a corresponding structure may be changed and a patterning process may be increased or decreased according to actual needs. For example, a fourth conductive layer may be formed on a side of the third conductive layer away from the base substrate, and an anode and a connection electrode of the pixel circuit may be provided on the fourth conductive layer. However, this embodiment is not limited thereto.

The manufacturing process of this exemplary embodiment may be implemented using an existing mature manufacturing device, and may be compatible well with an existing manufacturing process, simple in process implementation, easy to implement, high in a production efficiency, low in production cost, and high in yield rate.

The display substrate provided by the exemplary embodiment may save the space occupied by the shift register unit by optimizing the layout of the shift register unit, which is beneficial to achieving the display substrate with a narrow bezel.

An embodiment of the present disclosure further provides a preparation method of a display substrate, used for preparing the aforementioned display substrate, and the preparation method includes: providing a base substrate; and forming a gate drive circuit in a non-display region. The gate drive circuit includes a plurality of cascaded shift register units. The shift register unit includes an input circuit, a first control circuit, a second control circuit, and an output circuit. The input circuit is electrically connected with a first node, and the output circuit is electrically connected with a second node. The first control circuit is electrically connected to the first node, the second node, and the third node, and is configured to control the voltage of the second node under the control of the first node and the third node. The second control circuit is electrically connected to the first node and the third node, and is configured to control the voltage of the third node under the control of the first node. The first control circuit is located between the input circuit and the output circuit in the first direction and is arranged along the first direction, and the second control circuit is adjacent to the first control circuit in the second direction. Herein, the first direction and the second direction intersect.

For the method for manufacturing the display substrate in the present embodiment, reference may be made to descriptions of the aforementioned embodiments, and thus will not be repeated here.

Figure 8:
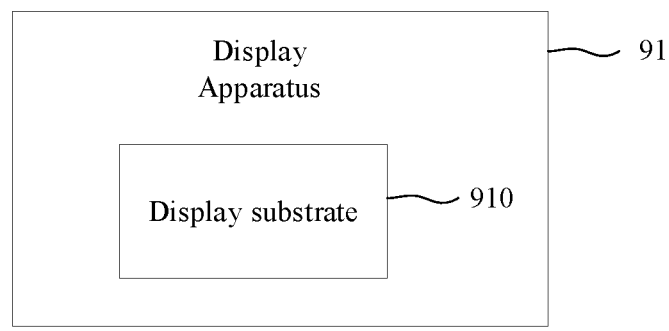
FIG. 8 is a schematic diagram of a display apparatus according to at least one embodiment of the present disclosure.

FIG. 8 is a schematic diagram of a display apparatus according to at least one embodiment of the present disclosure. As shown in FIG. 8, a display apparatus 91 according to this embodiment includes a display substrate 910. The display substrate 910 is the display substrate provided in the above-mentioned embodiments. The display substrate 910 may be an OLED display substrate, a QLED display substrate, a micro-LED display substrate, or a mini-LED display substrate. The display apparatus 91 may be any product or component with a display function, such as an OLED display apparatus, a watch, a mobile phone, a tablet computer, a television, a display, a laptop computer, a digital photo frame, and a navigator. However, this embodiment is not limited thereto.

The drawings of the present disclosure only involve structures involved in the present disclosure, and other structures may refer to conventional designs. The embodiments of the present disclosure and features in the embodiments may be combined to each other to obtain new embodiments if there is no conflict. Those of ordinary skills in the art should understand that modifications or equivalent replacements may be made on the technical solutions of the present disclosure without departing from the spirit and scope of the technical solutions of the present disclosure, and shall all fall within the scope of the claims of the present disclosure.

The invention claimed is:

1. A display substrate, comprising a display region and a non-display region, wherein the non-display region is provided with a gate drive circuit, and the gate drive circuit comprises a plurality of cascaded shift register units, which comprise an input circuit, a first control circuit, a second control circuit, and an output circuit;
   wherein the input circuit is electrically connected with a first node, and the output circuit is electrically connected with a second node;
   the first control circuit is electrically connected to the first node, the second node, and a third node, and is configured to control a voltage of the second node under control of the first node and the third node;
   the second control circuit is electrically connected with the first node and the third node, and is configured to control a voltage of the third node under control of the first node; and
   the first control circuit is located between the input circuit and the output circuit in a first direction, and the first control circuit is arranged along the first direction, and the second control circuit is adjacent to the first control circuit in a second direction, wherein the first direction intersects with the second direction,
   wherein the first control circuit comprises a second transistor and a third transistor;
   wherein active layers of the second transistor and the third transistor are of an integral structure and extend along the first direction;
   wherein the second control circuit at least comprises a seventh transistor;
   wherein control electrodes of the second transistor and the seventh transistor are of an integral structure and extend along the second direction;

wherein active layers of the second transistor and the seventh transistor are of an integral structure and form a U shape, and an opening of the U shape faces the input circuit.

2. The display substrate according to claim 1, wherein the input circuit, the first control circuit, and the second control circuit are all electrically connected to a first connection electrode extending along the first direction to achieve an electrical connection to the first node.

3. The display substrate according to claim 2, wherein an orthographic projection of the first connection electrode on a base substrate is located between the first control circuit and the second control circuit in the second direction.

4. The display substrate according to claim 1, wherein the second control circuit further comprises a first capacitor; wherein the first capacitor is located on a side of the seventh transistor away from the first control circuit in the second direction.

5. The display substrate according to claim 4, wherein the first capacitor comprises a first electrode plate and a second electrode plate, wherein the second electrode plate is located on a side of the first electrode plate away from a base substrate;
the first electrode plate has a first connection portion extending along the second direction, and the second electrode plate has a second connection portion extending along the second direction; and
an orthographic projection of the first connection portion and the second connection portion on the base substrate is overlapped with an orthographic projection of a first connection electrode on the base substrate.

6. The display substrate according to claim 4, wherein one electrode plate of the first capacitor is electrically connected to a second clock signal line and a second connection electrode;
wherein the second connection electrode has a first body and at least two first extension portions extending from the first body in the first direction;
the output circuit is electrically connected with an output terminal which is electrically connected with a third connection electrode, and the third connection electrode has a second body and at least two second extension portions extending from the second body along the first direction; and
the first extension portion and the second extension portion are interspersed with each other.

7. The display substrate according to claim 6, wherein a second body of the third connection electrode is electrically connected to a cascaded signal line, and the cascaded signal line is adjacent to the output circuit in the second direction and extends along the first direction.

8. The display substrate according to claim 6, wherein the output circuit at least comprises a fifth transistor and a second capacitor; wherein the fifth transistor is electrically connected with the second capacitor; the second capacitor is adjacent to the fifth transistor in the first direction and is located on a side of the fifth transistor close to the second control circuit; and
an orthographic projection of the first body of the second connection electrode on a base substrate is overlapped with an orthographic projection of the second capacitor on the base substrate.

9. The display substrate according to claim 1, wherein the shift register unit further comprises a third control circuit; the third control circuit is electrically connected with the first node, the second node, a second clock signal line and a first power supply line, and is configured to transmit a first voltage signal provided by the first power supply line to the first node under control of the second node and the second clock signal line; and
the third control circuit is located between the first control circuit and the output circuit in the first direction, and the third control circuit is arranged along the second direction.

10. The display substrate according to claim 9, wherein the first control circuit, the second control circuit, and the third control circuit are all electrically connected to a fourth connection electrode extending along the second direction to achieve an electrical connection to the second node.

11. The display substrate according to claim 9, wherein the third control circuit is electrically connected to the first control circuit, the second control circuit, and the input circuit through a first connection electrode extending along the first direction.

12. The display substrate according to claim 9, wherein the third control circuit comprises a sixth transistor and a ninth transistor; wherein active layers of the sixth transistor and the ninth transistor are of an integral structure and extend along the second direction.

13. The display substrate according to claim 11, wherein the first control circuit, the second control circuit, and the third control circuit are electrically connected to the first power supply line through a power supply connection electrode; and
the first power supply line is located on a side of the output circuit away from the third control circuit in the first direction, and the power connection electrode is located on a side of the third control circuit away from the first connection electrode.

14. The display substrate according to claim 1, wherein the shift register unit further comprises a fourth control circuit; wherein the fourth control circuit is electrically connected with the first node and the output circuit; and
the fourth control circuit is adjacent to the input circuit in the second direction.

15. The display substrate according to claim 14, wherein the fourth control circuit and the second power supply line are electrically connected; and in the first direction, the fourth control circuit and the input circuit are both adjacent to the second power supply line.

16. A display apparatus, comprising a display substrate according to claim 1.

17. A method for preparing a display substrate, used for preparing the display substrate of claim 1, wherein the method for preparing comprises:
providing a base substrate;
forming a gate drive circuit in a non-display region;
wherein the gate drive circuit comprises a plurality of cascaded shift register units;
the shift register unit comprises an input circuit, a first control circuit, a second control circuit and an output circuit; the input circuit is electrically connected with a first node, and the output circuit is electrically connected with a second node; the first control circuit is electrically connected to the first node, the second node, and a third node, and is configured to control a voltage of the second node under control of the first node and the third node; the second control circuit is electrically connected with the first node and the third node, and is configured to control a voltage of the third node under control of the first node; the first control circuit is located between the input circuit and the output circuit in a first direction and is arranged along the first direction, and the second control circuit is adjacent to the first control circuit in a second direction, wherein the first direction intersects with the second direction.

* * * * *